(12) United States Patent
Inokuchi et al.

(10) Patent No.: US 11,742,403 B2
(45) Date of Patent: Aug. 29, 2023

(54) SEMICONDUCTOR DEVICE

(71) Applicant: KABUSHIKI KAISHA TOSHIBA, Tokyo (JP)

(72) Inventors: Tomoaki Inokuchi, Yokohama Kanagawa (JP); Hiro Gangi, Ota Tokyo (JP); Yusuke Kobayashi, Nagareyama Chiba (JP); Hiroki Nemoto, Fuchu Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/399,278

(22) Filed: Aug. 11, 2021

(65) Prior Publication Data
US 2022/0293754 A1 Sep. 15, 2022

(30) Foreign Application Priority Data
Mar. 10, 2021 (JP) .................................. 2021-038317

(51) Int. Cl.
*H01L 29/423* (2006.01)
*H01L 29/78* (2006.01)
*H01L 29/47* (2006.01)

(52) U.S. Cl.
CPC .......... *H01L 29/4236* (2013.01); *H01L 29/47* (2013.01); *H01L 29/7813* (2013.01)

(58) Field of Classification Search
CPC ............. H01L 29/7786; H01L 29/4236; H01L 29/42364
See application file for complete search history.

(56) References Cited

U.S. PATENT DOCUMENTS 7,345,342 B2 3/2008 Challa et al.
8,415,711 B2 4/2013 Kitagawa
(Continued)

FOREIGN PATENT DOCUMENTS

JP 2007-529115 A 10/2007
JP 2012-89826 A 5/2012
(Continued)

OTHER PUBLICATIONS

Yamaguchi, Hitochi, et al., "Breakthrough of on-resistance Si limit by Super 3D Mosfet under 100V breakdown voltage," Proc. of the 18th Int'l Symp. on Power Semiconductor Devices & IC's, Jun. 4-8, 2006 (4 pages).

*Primary Examiner* — Fernando L Toledo
*Assistant Examiner* — Valerie N Newton
(74) *Attorney, Agent, or Firm* — Finnegan, Henderson, Farabow, Garrett & Dunner, LLP

(57) ABSTRACT

According to one embodiment, a semiconductor device includes first to third electrodes, a semiconductor member, a first conductive member, and an insulating part region. The second electrode includes a first electrode portion. The semiconductor member includes a first semiconductor region. The first semiconductor region includes first to third partial regions. The first partial region is between the first electrode and the first electrode portion. The second partial region is between the first and third electrodes. The third partial region is between the first partial region and the first electrode portion. The third partial region includes first and second positions. The second position is between the first partial region and the first position. The first conductive member includes first and second portions. The first portion is between the second partial region and the third electrode. The insulating part region includes first and second insulating regions.

20 Claims, 17 Drawing Sheets

(56) References Cited

U.S. PATENT DOCUMENTS

| | | |
|---|---|---|
| 9,525,059 B1 | 12/2016 | Kobayashi |
| 9,853,140 B2 | 12/2017 | Tipirneni et al. |
| 2021/0005730 A1* | 1/2021 | Mukai ............... H01L 29/42364 |
| 2021/0043750 A1* | 2/2021 | Neufeld ............. H01L 29/2003 |
| 2022/0123135 A1* | 4/2022 | Smith ................. H01L 29/0649 |

FOREIGN PATENT DOCUMENTS

| | | |
|---|---|---|
| JP | 2016-506082 A | 2/2016 |
| JP | 6400545 B2 | 10/2018 |
| WO | WO 2005/065385 A2 | 7/2005 |

* cited by examiner

SEMICONDUCTOR DEVICE

CROSS-REFERENCE TO RELATED APPLICATIONS

This application is based upon and claims the benefit of priority from Japanese Patent Application No. 2021-038317, filed on Mar. 10, 2021; the entire contents of which are incorporated herein by reference.

FIELD

Embodiments described herein relate generally to a semiconductor device.

BACKGROUND

It is desirable to improve the characteristics of a semiconductor device.

DETAILED DESCRIPTION

Figure 1:
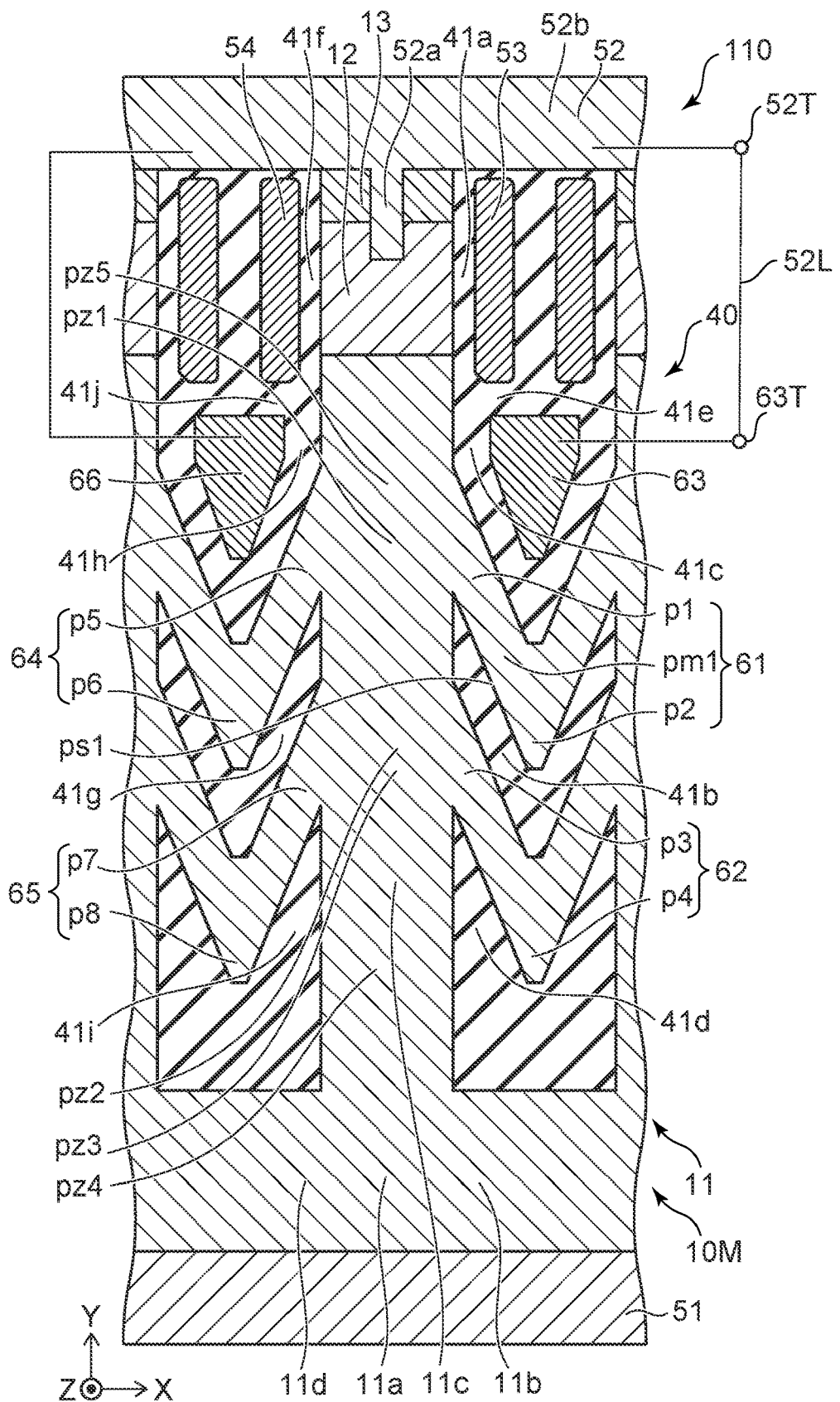
FIG. 1 is a schematic cross-sectional view illustrating a semiconductor device according to a first embodiment.

According to one embodiment, a semiconductor device includes a first electrode, a second electrode, a third electrode, a semiconductor member, a first conductive member, and an insulating part region. The second electrode includes a first electrode portion. A direction from the first electrode toward the first electrode portion is along a first direction. A direction from the first electrode toward the third electrode is along the first direction. The semiconductor member includes a first semiconductor region of a first conductivity type. The first semiconductor region includes a first partial region, a second partial region, and a third partial region. The first partial region is between the first electrode and the first electrode portion. The second partial region is between the first electrode and the third electrode. A direction from the first partial region toward the second partial region is along a second direction crossing the first direction. The third partial region is between the first partial region and the first electrode portion. The third partial region includes a first position and a second position. The second position is between the first partial region and the first position. The first conductive member includes a first portion and a second portion. The first portion is between the second partial region and the third electrode in the first direction. The first portion is connected with the first position. The second portion is connected with the first portion. A position in the first direction of the second portion is between a position in the first direction of the first portion and a position in the first direction of the second partial region. The insulating part region includes a first insulating region and a second insulating region. The first insulating region is between the third electrode and a portion of the semiconductor member in the second direction. The second insulating region is between the second position and the first electrode in the first direction. The second insulating region is between the second position and the second portion in the second direction.

According to one embodiment, a semiconductor device includes a first electrode, a semiconductor member, a second electrode, a gate electrode, a first insulating member, and a second insulating member. The semiconductor member includes a first semiconductor region located on the first electrode, the first semiconductor region being of a first conductivity type, a second semiconductor region located on a portion of the first semiconductor region, the second semiconductor region being of a second conductivity type, and a third semiconductor region located on the second semiconductor region, the third semiconductor region being of the first conductivity type. The second electrode is located on the third semiconductor region and electrically connected to the third semiconductor region. The gate electrode is located between the first semiconductor region and the second electrode. The first insulating member is located between the gate electrode and the semiconductor member and between the gate electrode and the second electrode. The second insulating member is located in the first semiconductor region and separated from the first insulating member in a first direction from the first electrode toward the second electrode. The second insulating member includes a first portion, a second portion extending from the first portion toward the second electrode in the first direction, and a third portion extending from the first portion toward the second electrode in the first direction. The third portion is separated from the second portion in a second direction crossing the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a semiconductor member 10M, a first conductive member 61, and an insulating part region 40.

The second electrode 52 includes a first electrode portion 52a. The direction from the first electrode 51 toward the first electrode portion 52a is along a first direction.

The first direction is taken as a Y-axis direction. One direction perpendicular to the Y-axis direction is taken as an X-axis direction. A direction perpendicular to the Y-axis direction and the X-axis direction is taken as a Z-axis direction.

The direction from the first electrode 51 toward the third electrode 53 is along the first direction (the Y-axis direction). For example, the direction from at least a portion of the first electrode portion 52a toward the third electrode 53 is along a second direction. The second direction crosses the first direction. The second direction is, for example, the X-axis direction. The position in the second direction (the X-axis direction) of the first electrode portion 52a is different from the position in the second direction of the third electrode 53.

The semiconductor member 10M includes a first semiconductor region 11 of a first conductivity type. The first conductivity type is one of an n-type or a p-type. Hereinbelow, the first conductivity type is the n-type.

The first semiconductor region 11 includes a first partial region 11a, a second partial region 11b, and a third partial region 11c. The first partial region 11a is between the first electrode 51 and the first electrode portion 52a. The second partial region 11b is between the first electrode 51 and the third electrode 53. The direction from the first partial region 11a toward the second partial region 11b is along the second direction (e.g., the X-axis direction). The third partial region 11c is between the first partial region 11a and the first electrode portion 52a. The boundaries of these partial regions may be indistinct.

For example, the third partial region 11c includes a first position pz1 and a second position pz2. The second position pz2 is between the first partial region 11a and the first position pz1.

The first conductive member 61 includes a first portion p1 and a second portion p2. The first portion p1 is between the second partial region 11b and the third electrode 53 in the first direction (the Y-axis direction). The first portion p1 is connected with the first position pz1. Thus, the first portion p1 is connected with a portion of the third partial region 11c. For example, the first portion p1 is continuous with the first position pz1 (the third partial region 11c). The boundary between the first portion p1 and the third partial region 11c may be indistinct. For example, the first portion p1 may include a semiconductor material (e.g., a first semiconductor material). In such a case, the first portion p1 is continuous with the first position pz1 (the third partial region 11c).

The second portion p2 is connected with the first portion p1. The position in the first direction (the Y-axis direction) of the second portion p2 is between the position in the first direction of the first portion p1 and the position in the first direction of the second partial region 11b (which may be, for example, the first electrode 51). For example, the distance along the Y-axis direction between the first electrode 51 and the first portion p1 is greater than the distance along the Y-axis direction between the first electrode 51 and the second portion p2.

The insulating part region 40 includes a first insulating region 41a and a second insulating region 41b. The first insulating region 41a is between the third electrode 53 and a portion of the semiconductor member 10M in the second direction (the X-axis direction). The second insulating region 41b is between the second position pz2 and the first electrode 51 in the first direction (the Y-axis direction). The second insulating region 41b is between the second portion p2 and the second position pz2 (e.g., a portion of the third partial region 11c) in the second direction (the X-axis direction). The second insulating region 41b electrically insulates between the third partial region 11c and the second portion p2. The second insulating region 41b electrically insulates between the second portion p2 and a third portion p3 that is described below. The second insulating region 41b electrically insulates between the second portion p2 and a fourth portion p4 that is described below. The second insulating region 41b is separated from the first insulating region 41a in the first direction (the Y-axis direction). The second insulating region 41b is, for example, V-shaped. For example, the second insulating region 41b includes a bottom portion and two extension portions. The distance along the first direction (the Y-axis direction) between the bottom portion and the first electrode 51 is less than the distance along the first direction (the Y-axis direction) between the second portion p2 and the first electrode 51. One of the two extension portions extends from the bottom portion toward the second electrode 52 in a direction that includes a first-direction component. The other one of the two extension portions extends from the bottom portion toward the second electrode 52 in another direction that includes a first-direction component. The two extension portions are separated from each other. The second portion p2 is positioned between the two extension portions. The second insulating region 41b electrically insulates between the third partial region 11c and the second portion p2.

In the example as shown in FIG. 1, the semiconductor member 10M includes a second semiconductor region 12 and a third semiconductor region 13. The second semiconductor region 12 is of a second conductivity type. The second conductivity type is the other of the n-type or the p-type. Hereinbelow, the second conductivity type is the p-type. The third semiconductor region 13 is the first conductivity type (e.g., the n-type).

The second semiconductor region 12 is between the third partial region 11c and the second electrode 52 in the first direction (the Y-axis direction). For example, at least a portion of the second semiconductor region 12 is between the third partial region 11c and the first electrode portion 52a. The direction from the second semiconductor region 12 toward the third electrode 53 is along the second direction (e.g., the X-axis direction). At least a portion of the third semiconductor region 13 is between the second semiconductor region 12 and the second electrode 52. The third semiconductor region 13 is electrically connected with the second electrode 52.

At least a portion of the first insulating region 41a is between the second semiconductor region 12 and the third electrode 53.

The current that flows between the first electrode 51 and the second electrode 52 can be controlled by the potential of the third electrode 53. The potential of the third electrode 53 is, for example, a potential that is referenced to the second electrode 52. For example, the first electrode 51 functions as a drain electrode. The second electrode 52 functions as a source electrode. The third electrode 53 functions as a gate electrode. The first insulating region 41a functions as a gate insulating film. The semiconductor device 110 is, for example, a transistor. For example, the first semiconductor region 11 functions as at least a portion of a drift layer. The current that flows between the first electrode 51 and the second electrode 52 is large in a state in which the potential of the third electrode 53 is not less than a threshold voltage. This state is, for example, the on-state. The current that flows between the first electrode 51 and the second electrode 52 is small in a state in which the potential of the third electrode 53 is less than the threshold voltage. This state is, for example, the off-state.

When operating, a voltage is applied between the first electrode 51 and the second electrode 52 in the off-state. Thereby, an electric field distribution is generated in the third partial region 11c of the first semiconductor region 11. For example, the breakdown voltage is reduced when a portion occurs at which the electric field is locally high.

According to the embodiment, the first conductive member described above is provided. In the off-state of the semiconductor device 110, the potential of the first portion p1 of the first conductive member 61 becomes, for example, equal to the potential of the first position pz1 (the position of the third partial region 11c to which the first portion p1 is connected). The potential of the second portion p2 becomes equal to the potential of the first portion p1. The second portion p2 is more proximate to the first electrode 51 than the first position pz1 to which the first portion p1 is connected. Such a potential of the second portion p2 becomes greater than the potential of the first position pz1. For example, the second portion p2 can function as a field plate. For example, the field plate relaxes the electric field that is applied to the third partial region 11c. A high breakdown voltage is easily obtained. A high breakdown voltage is obtained in the semiconductor device 110 according to the embodiment. According to the embodiment, a semiconductor device can be provided in which the characteristics can be improved.

The potential difference between the second portion p2 and the second position pz2 can be reduced. The distance in the second direction (the X-axis direction) between the second position pz2 and the second portion p2 (the thickness along the X-axis direction of the second insulating region 41b illustrated in FIG. 1) can be reduced thereby. Therefore, the length (the cell pitch) in the X-axis direction of one cell (one operation region) can be reduced. The number of cells per unit area can be increased thereby. The on-resistance (RonA) can be reduced thereby. The local concentration of the electric field is suppressed. In the semiconductor device 110, the local concentration of the electric field is suppressed. For example, the charge capacitance characteristic (e.g., a drain-source charge amount Qoss) of the semiconductor device 110 can be reduced thereby. According to the embodiment, a semiconductor device can be provided in which the characteristics can be improved.

In embodiments as described above, the potential of the second portion p2 that can function as a field plate becomes equal to the potential of the first portion p1. For example, in a reference example that includes a floating field plate, an electrical element (e.g., an external capacitor, an external discharge resistance, or the like) is necessary to control the potential of the floating field plate. According to the embodiment, the potential of the second portion p2 that can function as a field plate can be controlled without using such an electrical element.

As described below, at least one of the first portion p1 or the second portion p2 may be included in the semiconductor member 10M. At least a portion of at least one of the first portion p1 or the second portion p2 may be included in a conductive member other than the semiconductor member 10M.

As shown in FIG. 1, the position in the second direction (the X-axis direction) of the first portion p1 is between the position in the second direction of the third partial region 11c and the position in the second direction of the second portion p2. In the example as shown in FIG. 1, the first conductive member 61 includes a middle portion pm1 between the first portion p1 and the second portion p2. The middle portion pm1 includes an oblique surface ps1 that is oblique to the first direction (the Y-axis direction) and the second direction (the X-axis direction).

As shown in FIG. 1, the insulating part region 40 may further include a third insulating region 41c. The third insulating region 41c is between the first conductive member 61 and the third electrode 53. The third insulating region 41c electrically insulates between the first conductive member 61 and the third electrode 53.

As shown in FIG. 1, the semiconductor device 110 may further include a second conductive member 62. The second conductive member 62 includes the third portion p3 and the fourth portion p4. The third partial region 11c further includes a third position pz3 and a fourth position pz4. The third position pz3 is between the first partial region 11a and the first position pz1. The fourth position pz4 is between the first partial region 11a and the third position pz3.

The third portion p3 is between the second partial region 11b and the first portion p1 in the first direction (the Y-axis direction). The third portion p3 is connected with the third position pz3 (another portion of the third partial region 11c). For example, the third portion p3 is continuous with the third position pz3. The boundary between the third portion p3 and the third position pz3 may be indistinct. For example, the third portion p3 may include a semiconductor material (e.g., a second semiconductor material). In such a case, the third portion p3 is continuous with the third position pz3.

The fourth portion p4 is connected with the third portion p3. The position in the first direction (the Y-axis direction) of the fourth portion p4 is between the position in the first direction of the third portion p3 and the position in the first direction of the second partial region 11b. The insulating part region 40 further includes a fourth insulating region 41d. The fourth insulating region 41d is between the fourth position pz4 and the fourth portion p4 in the second direction (the X-axis direction). For example, the second conductive member 62 functions as another field plate. In the semiconductor device 110, the electric field is controlled in stages by a multistage field plate. A higher breakdown voltage is obtained. A semiconductor device can be provided in which the characteristics can be further improved.

In the example as shown in FIG. 1, the semiconductor device 110 further includes a third conductive member 63. The position in the first direction (the Y-axis direction) of the third conductive member 63 is between the position in the first direction of the first portion p1 and the position in the first direction of the third electrode 53.

The third partial region 11c further includes a fifth position pz5. The fifth position pz5 is between the first position pz1 and the first electrode portion 52a. For example, the insulating part region 40 further includes a fifth insulating region 41e. The fifth insulating region 41e is between the first conductive member 61 and the third electrode 53. The fifth insulating region 41e electrically insulates between the first conductive member 61 and the third electrode 53. For example, the third insulating region 41c is between the fifth position pz5 and the third conductive member 63.

The third conductive member 63 is electrically connected with the second electrode 52. Or, the third conductive member 63 is electrically connectable with the second electrode 52. For example, the third conductive member 63 is electrically connected with the second electrode 52 by a connection member 52L. For example, a terminal 63T that is electrically connected with the third conductive member 63 may be provided. For example, a terminal 52T that is electrically connected with the second electrode 52 may be provided. For example, the connection member 52L may electrically connect the terminal 63T and the terminal 52T. The connection member 52L may be provided separately from the semiconductor device 110. By providing the third conductive member 63, a higher breakdown voltage is easily obtained. A semiconductor device can be provided in which the characteristics can be further improved.

As shown in FIG. 1, the semiconductor device 110 may further include a fourth electrode 54 and a fourth conductive member 64. The direction from the fourth electrode 54 toward the third electrode 53 is along the second direction (the X-axis direction). The first semiconductor region 11 further includes a fourth partial region 11d. The first partial region 11a is between the fourth partial region 11d and the second partial region 11b in the second direction (the X-axis direction).

The fourth conductive member 64 includes a fifth portion p5 and a sixth portion p6. The fifth portion p5 is between the fourth partial region 11d and the fourth electrode 54 in the first direction (the Y-axis direction). The fifth portion p5 is connected with the first position pz1. The fifth portion p5 may be continuous with the first position pz1. The fifth portion p5 may include a semiconductor material. The boundary between the fifth portion p5 and the first position pz1 (a portion of the third partial region 11c) may be indistinct.

The sixth portion p6 is connected with the fifth portion p5. The position in the first direction (the Y-axis direction) of the sixth portion p6 is between the position in the first direction of the fifth portion p5 and the position in the first direction of the fourth partial region 11d.

The insulating part region 40 includes, for example, a sixth insulating region 41f, a seventh insulating region 41g, and an eighth insulating region 41h. The sixth insulating region 41f is between the fourth electrode 54 and a portion of the semiconductor member 10M (which may be, for example, a portion of the third partial region 11c) in the second direction (the X-axis direction). The seventh insulating region 41g is between the sixth portion p6 and the second position pz2 in the second direction (the X-axis direction). The eighth insulating region 41h is between the fourth conductive member 64 and the fourth electrode 54.

For example, the fourth electrode 54 functions as another gate electrode. The fourth electrode 54 may be electrically connected with the third electrode 53. The fourth conductive member 64 functions as another field plate.

As shown in FIG. 1, the semiconductor device 110 may include a fifth conductive member 65. The fifth conductive member 65 includes a seventh portion p7 and an eighth portion p8. The seventh portion p7 is between the fourth partial region 11d and the fifth portion p5 in the first direction (the Y-axis direction). The seventh portion p7 is connected with the third position pz3 (another portion of the third partial region 11c). For example, the seventh portion p7 is continuous with the third position pz3. The boundary between the seventh portion p7 and the third position pz3 may be indistinct. For example, the seventh portion p7 may include a semiconductor material. In such a case, the seventh portion p7 is continuous with the third position pz3.

The eighth portion p8 is connected with the seventh portion p7. The position in the first direction (the Y-axis direction) of the eighth portion p8 is between the position in the first direction of the seventh portion p7 and the position in the first direction of the fourth partial region 11d. The insulating part region 40 further includes a ninth insulating region 41i. The ninth insulating region 41i is between the fourth position pz4 and the eighth portion p8 in the second direction (the X-axis direction). For example, the fifth conductive member 65 functions as another field plate. A higher breakdown voltage is obtained. A semiconductor device can be provided in which the characteristics can be further improved.

In the example as shown in FIG. 1, the semiconductor device 110 further includes a sixth conductive member 66. The position in the first direction (the Y-axis direction) of the sixth conductive member 66 is between the position in the first direction of the fifth portion p5 and the position in the first direction of the fourth electrode 54.

The insulating part region 40 further includes a tenth insulating region 41j. The tenth insulating region 41j is between the sixth conductive member 66 and the fourth electrode 54. The tenth insulating region 41j electrically insulates between the sixth conductive member 66 and the fourth electrode 54. For example, the eighth insulating region 41h is between the sixth conductive member 66 and the fifth position pz5.

The sixth conductive member 66 is electrically connected with the second electrode 52. Or, the sixth conductive member 66 is electrically connectable with the second electrode 52. By providing the sixth conductive member 66, a higher breakdown voltage is easily obtained. A semiconductor device can be provided in which the characteristics can be further improved.

As shown in FIG. 1, the second electrode 52 may include a second electrode portion 52b. The third electrode 53 and the fourth electrode 54 may be located between the semiconductor member 10M and the second electrode portion 52b. A portion of the insulating part region 40 may be located in a region between the third electrode 53 and the second electrode portion 52b and a region between the fourth electrode 54 and the second electrode portion 52b.

Figure 2:
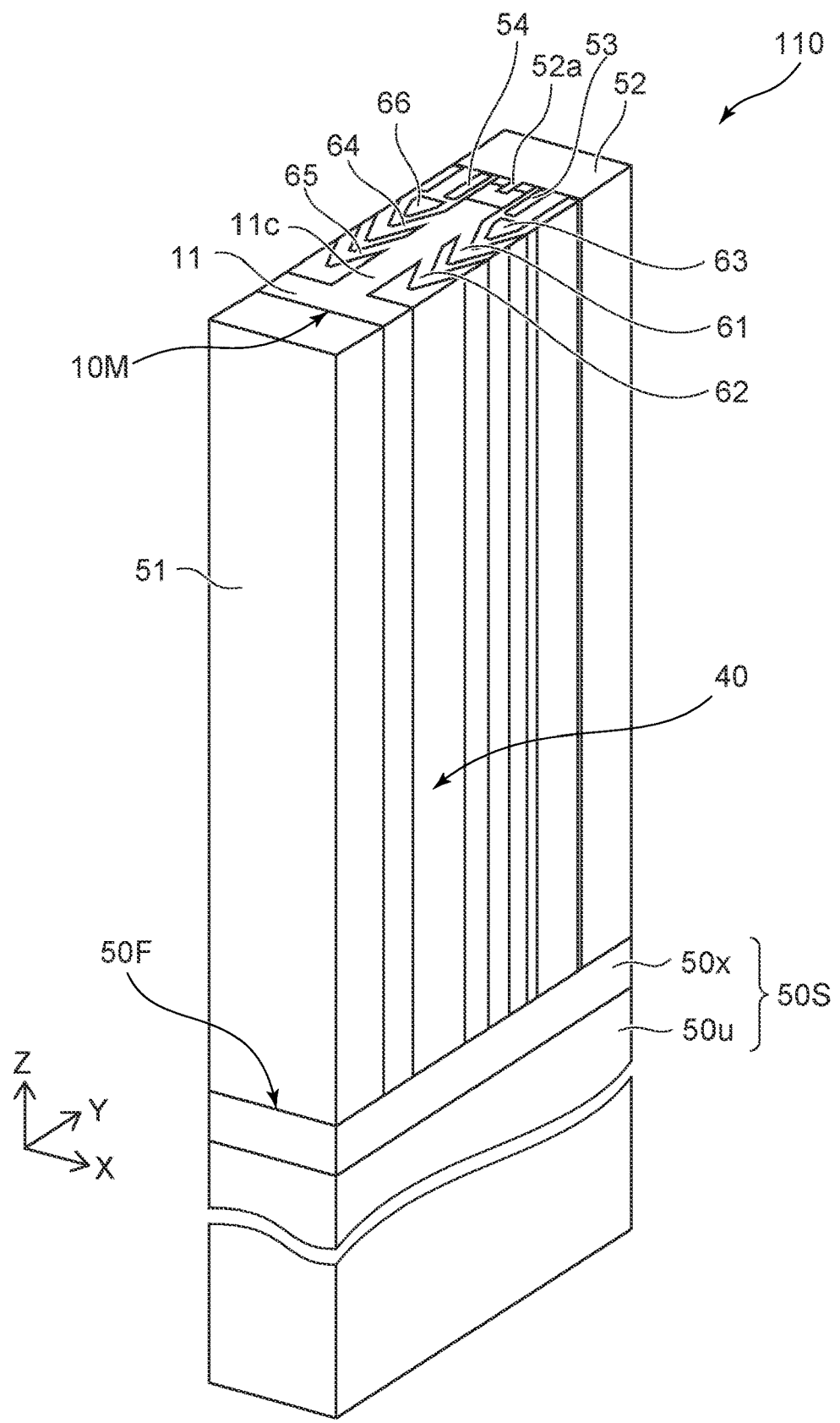
FIG. 2 is a schematic perspective view illustrating the semiconductor device according to the first embodiment.

FIG. 2 is a schematic perspective view illustrating the semiconductor device according to the first embodiment.

As shown in FIG. 2, the semiconductor device 110 according to the embodiment may include a first member 50S. The first member 50S is, for example, a supporter. The first member 50S may be, for example, a substrate. The first member 50S includes a first surface 50F. The first surface 50F is along a plane (the Y-X plane) that includes the first and second directions.

In the example, the first member 50S includes a substrate part 50u and an insulating layer 50x. The substrate part 50u is, for example, a silicon substrate. The insulating layer 50x is located on the substrate part 50u. The insulating layer 50x is, for example, a silicon oxide layer (e.g., a thermal oxide film). In the example, the first surface 50F corresponds to the upper surface of the insulating layer 50x. The first electrode 51, the second electrode 52, the third electrode 53, the first conductive member 61, the semiconductor member 10M, the insulating part region 40, etc., are located on the first surface 50F.

As shown in FIG. 2, the first electrode 51 and the second electrode 52 may extend along a third direction. The third direction crosses a plane that includes the first and second directions. The third direction may be perpendicular to the plane that includes the first and second directions. The third direction is, for example, the Z-axis direction. The semiconductor device 110 is, for example, a 3D semiconductor device.

Figure 3:
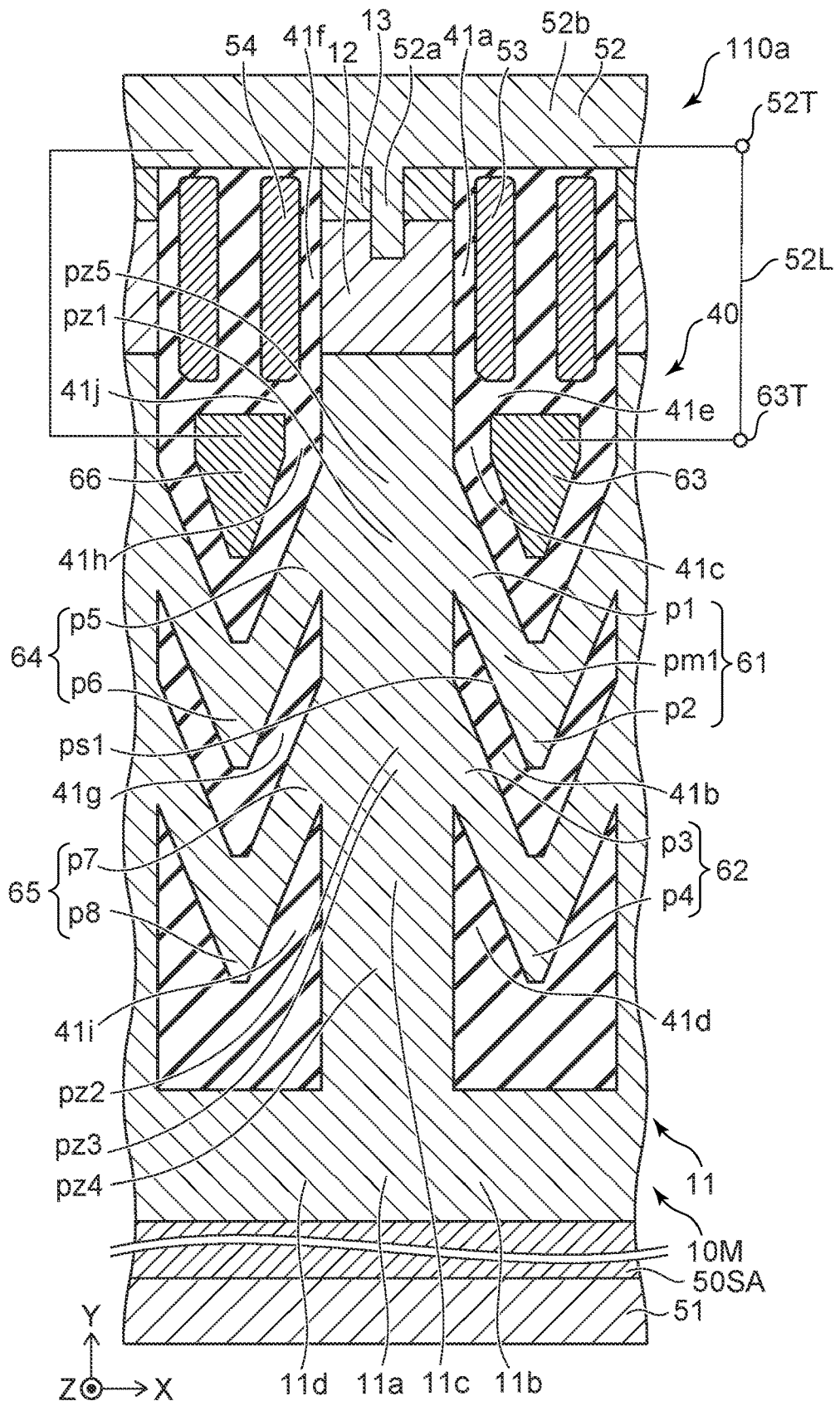
FIG. 3 is a schematic cross-sectional view illustrating a semiconductor device according to the first embodiment.

FIG. 3 is a schematic cross-sectional view illustrating a semiconductor device according to the first embodiment.

As shown in FIG. 3, the semiconductor device 110a according to the embodiment includes a first member 50SA. In the semiconductor device 110a, the first member 50SA is between the first electrode 51 and the first semiconductor region 11. The first member 50SA may be, for example, a semiconductor substrate (e.g., a silicon substrate, etc.). Otherwise, the configuration of the semiconductor device 110a may be similar to that of the semiconductor device 110. The semiconductor device 110a is, for example, a planar semiconductor device. The semiconductor device according to embodiments described below may be 3D or planar.

Figure 4:
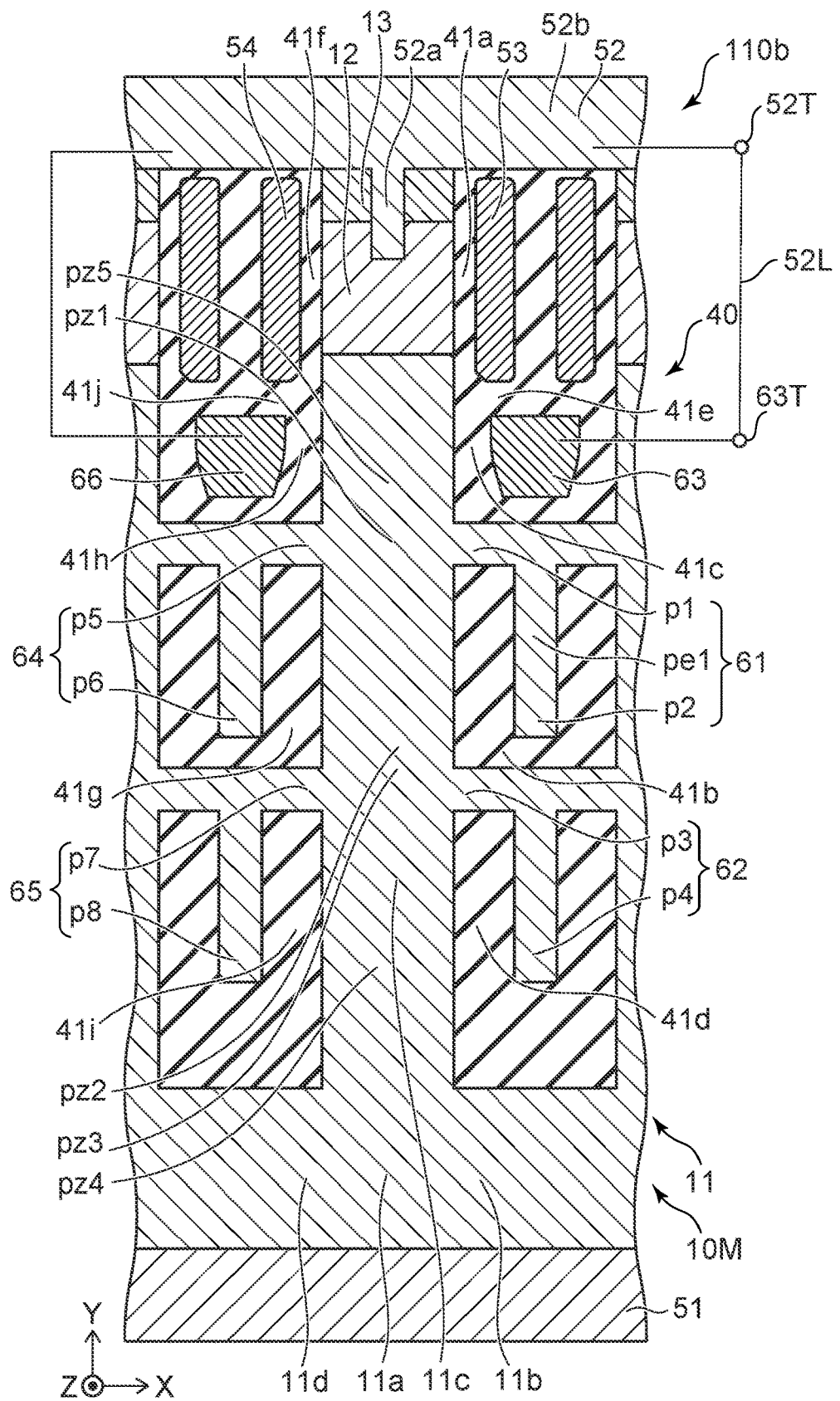
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, the semiconductor device 110b according to the embodiment also includes the first electrode 51, the second electrode 52, the third electrode 53, the semiconductor member 10M, the first conductive member 61, and the insulating part region 40. The configuration of the first conductive member 61 of the semiconductor device 110b is different from the configuration of the first conductive member of the semiconductor device 110. Otherwise, the configuration of the semiconductor device 110b may be similar to that of the semiconductor device 110 (or the semiconductor device 110a).

In the semiconductor device 110b, the first conductive member 61 includes a first extension portion pe1. The first portion p1 extends along the second direction (the X-axis direction). The first extension portion pe1 is connected with the first portion p1 and extends along the first direction (the Y-axis direction). The second portion p2 is connected with the first extension portion pe1. The first conductive member 61 is, for example, "T-shaped". For example, a high breakdown voltage is obtained even when such a first conductive member 61 is provided. For example, a low on-resistance (RonA) is obtained. For example, a small charge capacitance characteristic (e.g., the drain-source charge amount Qoss) is obtained. A semiconductor device can be provided in which the characteristics can be improved.

According to the embodiment, the shapes of the second conductive member 62, the fourth conductive member 64, and the fifth conductive member 65 may be similar to the shape of the first conductive member 61. Such shapes are applicable to any embodiment described below.

Figure 5:
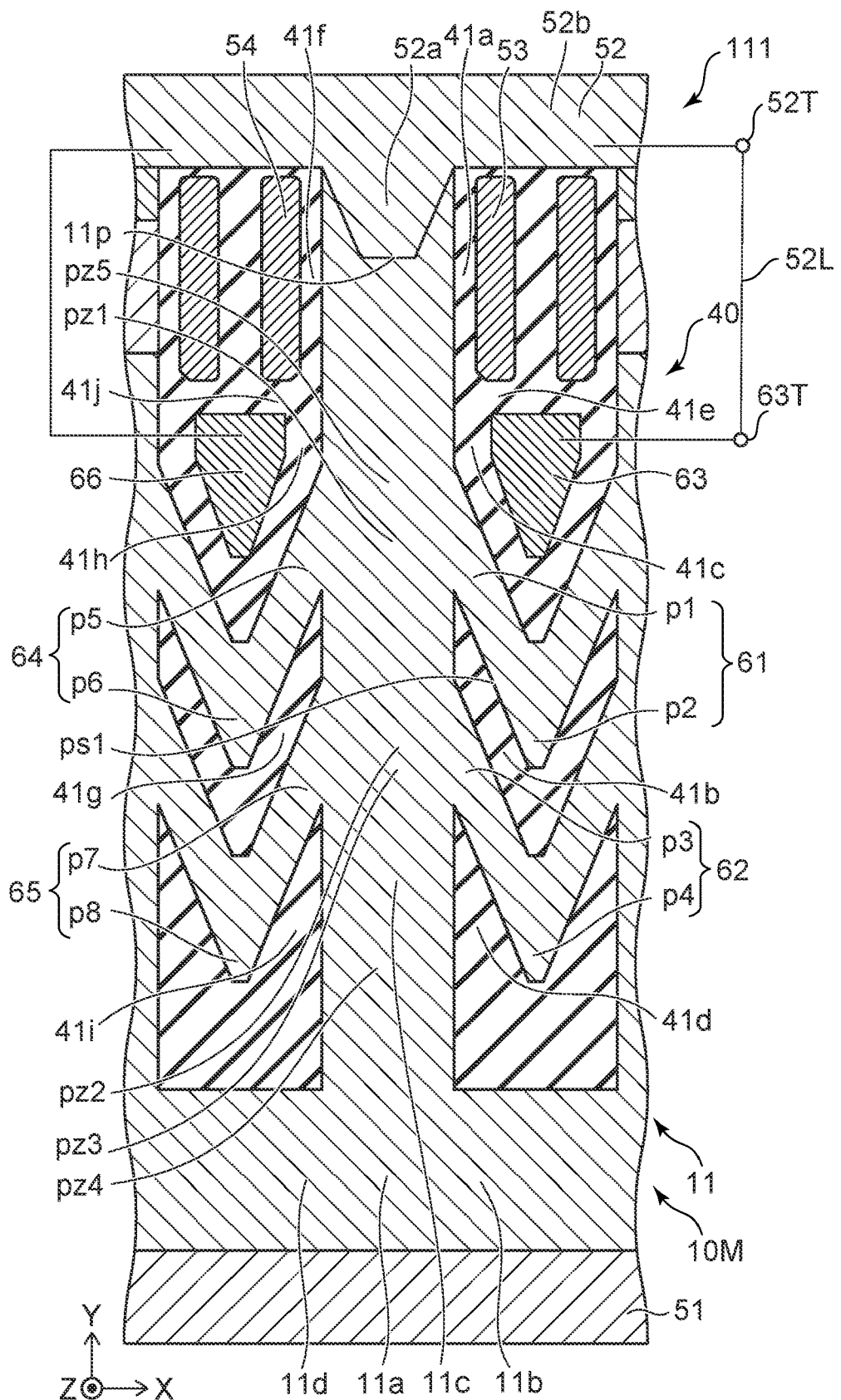
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, the semiconductor device 111 according to the embodiment also includes the first electrode 51, the second electrode 52, the third electrode 53, the semiconductor member 10M, the first conductive member 61, and the insulating part region 40. The configuration of the semiconductor member 10M of the semiconductor device 111 is different from the configuration of the semiconductor member 10M of the semiconductor device 110. Otherwise, the configuration of the semiconductor device 111 may be similar to that of the semiconductor device 110 (or the semiconductor device 110a, etc.).

The second semiconductor region 12 and the third semiconductor region 13 are not included in the semiconductor device 111. In the semiconductor device 111, the first semiconductor region 11 includes an electrode-facing surface 11p. The electrode-facing surface 11p is between the third partial region 11c and the first electrode portion 52a. At least a portion of the first insulating region 41a is between the electrode-facing surface 11p and the third electrode 53. For example, the electrode-facing surface 11p has a Schottky contact with the first electrode portion 52a.

In the semiconductor device 111 as well, the first conductive member 61 functions as a field plate. For example, a high breakdown voltage is obtained. For example, a low on-resistance (RonA) is obtained. For example, a small charge capacitance characteristic (e.g., the drain-source charge amount Qoss) is obtained. A semiconductor device can be provided in which the characteristics can be improved.

In the semiconductor device 111, a Schottky barrier is formed at the interface (e.g., the electrode-facing surface 11p) between the third partial region 11c and the second electrode 52. The thickness (e.g., the length in the Y-axis direction) of the Schottky barrier can be controlled by the potential of the third electrode 53. A current substantially does not flow when the Schottky barrier is thick. The off-state is obtained thereby. By controlling the potential of the third electrode 53, the Schottky barrier is made thin and, for example, a tunnel current flows. The on-state is obtained by causing the tunnel current to flow. According to the embodiment, a semiconductor device can be provided in which the characteristics can be improved. In the semiconductor device 111, the recovery can be faster because the body diode is a Schottky diode.

According to the embodiment, the semiconductor member 10M (e.g., the first semiconductor region 11) may include, for example, at least one selected from the group consisting of silicon (Si), a nitride semiconductor (e.g., GaN or the like), silicon carbide (SiC), and an oxide semiconductor (e.g., GaO). When the first semiconductor region 11 includes silicon, the first-conductivity-type impurity includes, for example, at least one selected from the group consisting of phosphorus, arsenic, and antimony.

In one example, when the third partial region 11c of the first semiconductor region 11 includes silicon, the first electrode portion 52a (e.g., a portion of the second electrode 52) includes at least one selected from the group consisting of Ti, W, Mo, Ta, Zr, Al, Sn, V, Re, Os, Ir, Pt, Pd, Rh, Ru, Nb, Sr, and Hf.

The first electrode 51 includes, for example, Al, Cu, Mo, W, Ta, Co, Ru, Ti, Pt, etc. The second electrode portion 52b of the second electrode 52 includes, for example, at least one selected from the group consisting of Al, Cu, Mo, W, Ta, Co, Ru, Ti, and Pt. The third electrode 53 may include, for example, at least one of polysilicon or a metal.

Second Embodiment

Figure 6:
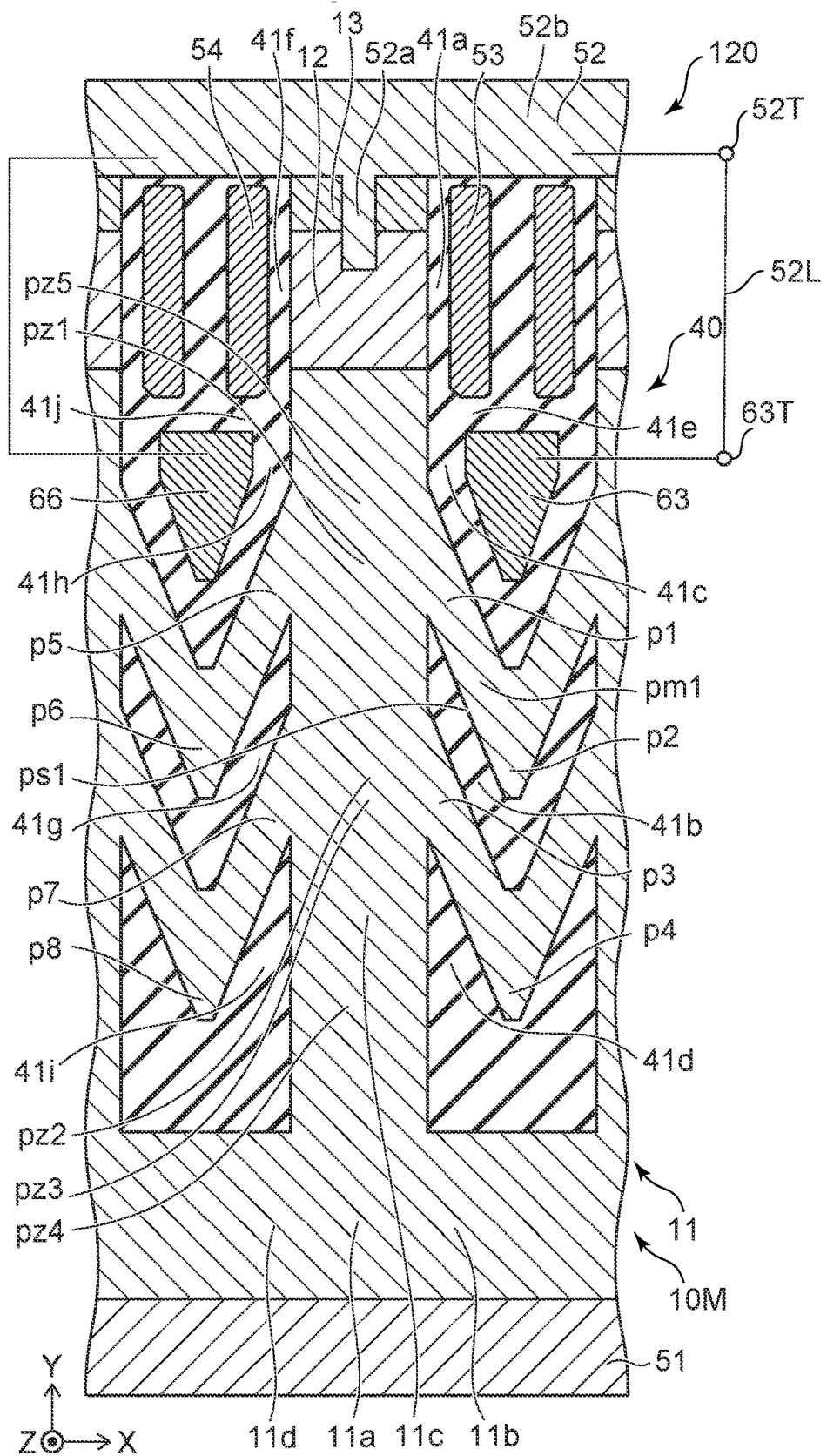
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, the semiconductor device 120 according to the embodiment includes the first electrode 51, the second electrode 52, the third electrode 53, the semiconductor member 10M, and the insulating part region 40. In the semiconductor device 120, a portion of the first semiconductor region 11 is the first portion p1, the second portion p2, etc., described above. Otherwise, the configuration of the semiconductor device 120 may be similar to the configuration of any semiconductor device according to the first embodiment.

In the semiconductor device 120 as well, the direction from the first electrode 51 toward the first electrode portion 52a is along the first direction (the Y-axis direction). The direction from the first electrode 51 toward the third electrode 53 is along the first direction. The direction from at least a portion of the first electrode portion 52a toward the third electrode 53 is along the second direction (e.g., the X-axis direction) that crosses the first direction.

In the semiconductor device 120, the semiconductor member 10M includes the first semiconductor region 11 that is of the first conductivity type. The first semiconductor region 11 includes the first partial region 11a, the second partial region 11b, the third partial region 11c, the first portion p1, and the second portion p2. The first partial region 11a is between the first electrode 51 and the first electrode portion 52a. The second partial region 11b is between the first electrode 51 and the third electrode 53. The direction from the first partial region 11a toward the second partial region 11b is along the second direction (the X-axis direction). The third partial region 11c is between the first partial region 11a and the first electrode portion 52a. The third partial region 11c includes the first position pz1 and the second position pz2. The second position pz2 is between the first partial region 11a and the first position pz1.

The first portion p1 is between the second partial region 11b and the third electrode 53 in the first direction (the Y-axis direction). The first portion p1 is connected with the first position pz1. The boundary between the first portion p1 and the first position pz1 may be indistinct. The first portion p1 and the first position pz1 are continuous.

The second portion p2 is connected with the first portion p1. The position in the first direction (the Y-axis direction) of the second portion p2 is between the position in the first direction of the first portion p1 and the position in the first direction of the second partial region 11b.

The insulating part region 40 includes the first insulating region 41a and the second insulating region 41b. The first insulating region 41a is between the third electrode 53 and a portion of the semiconductor member 10M in the second direction (the X-axis direction). The second insulating region 41b is between the second position pz2 and the second portion p2 in the second direction (the X-axis direction).

In the semiconductor device 120 as well, the second portion p2 functions as a field plate. For example, a high breakdown voltage is obtained. For example, a low on-resistance (RonA) is obtained. For example, a small charge capacitance characteristic (e.g., the drain-source charge amount Qoss) is obtained. A semiconductor device can be provided in which the characteristics can be improved.

According to the embodiment, the first portion p1 may be included in the semiconductor member 10M; and the second portion p2 may be included in the first conductive member 61.

In the semiconductor device 120, at least one of the third portion p3, the fourth portion p4, the fifth portion p5, the sixth portion p6, the seventh portion p7, or the eighth portion p8 may be included in the semiconductor member 10M. At least one of the third portion p3, the fourth portion p4, the fifth portion p5, the sixth portion p6, the seventh portion p7, or the eighth portion p8 may be included in a conductive member other than the semiconductor member 10M.

An example of a method for manufacturing the semiconductor device according to the embodiment will now be described.

Figure 7:
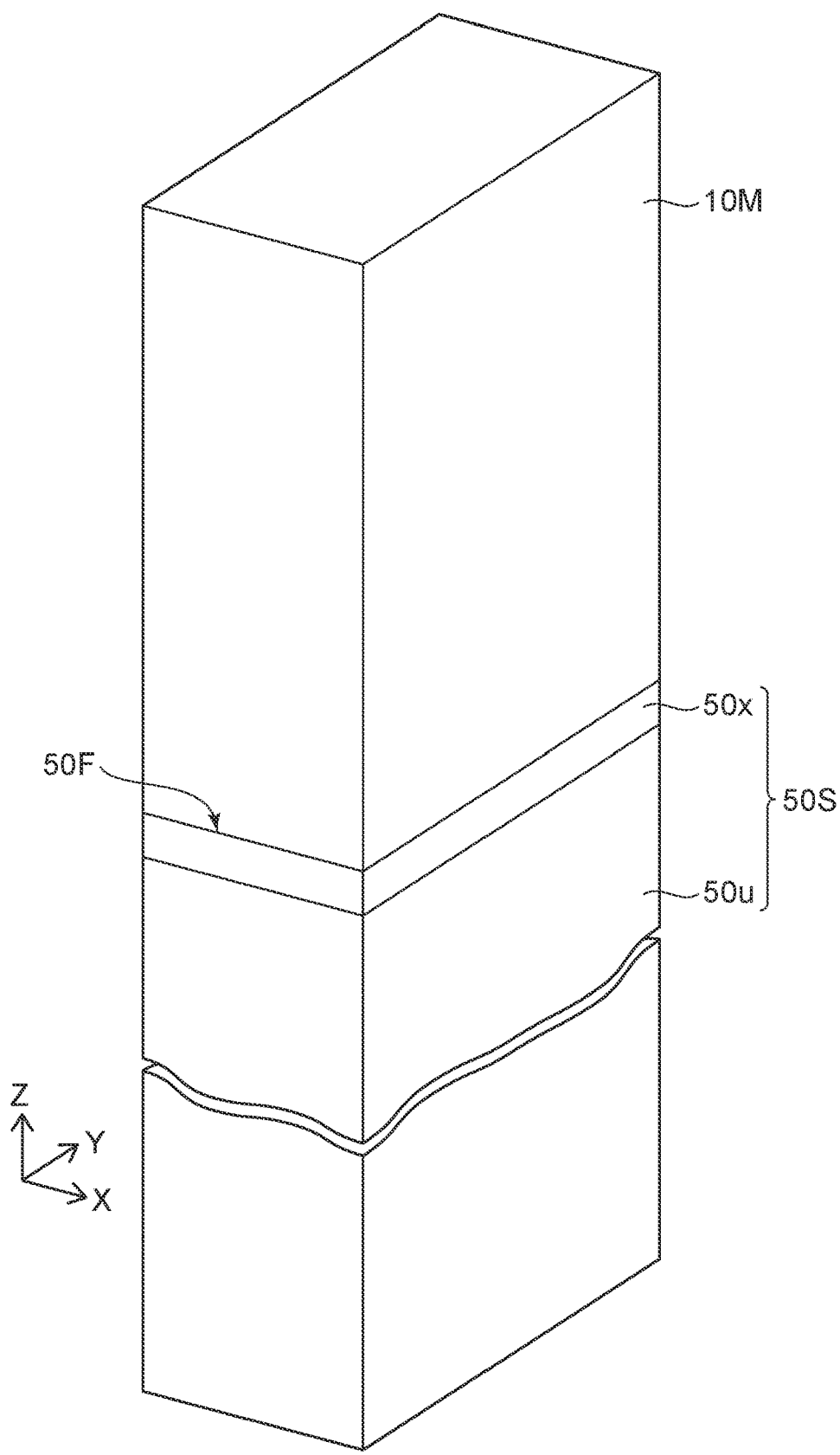
FIG. 7 is a schematic perspective view illustrating the method for manufacturing the semiconductor device according to the embodiment.

FIG. 7 is a schematic perspective view illustrating the method for manufacturing the semiconductor device according to the embodiment.

FIGS. 8A to 8D are schematic cross-sectional views illustrating the method for manufacturing the semiconductor device according to the embodiment.

As shown in FIG. 7, the semiconductor member 10M is located on the first surface 50F of the first member 50S. In the example, the semiconductor member 10M is silicon.

Figure 8A:
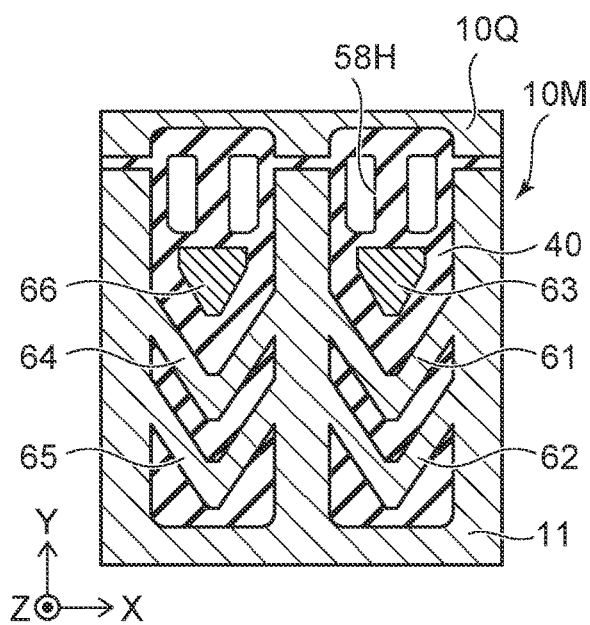
FIGS. 8A to 8D are schematic cross-sectional views illustrating the method for manufacturing the semiconductor device according to the embodiment.

As shown in FIG. 8A, for example, a portion of the semiconductor member 10M is removed by RIE (Reactive Ion Etching), etc.; and silicon oxide is formed in the removed region. The insulating part region 40 is obtained thereby. A portion of the semiconductor member 10M becomes the first to sixth conductive members 61 to 66. A hole 58H is formed in a portion of the semiconductor member 10M. The hole 58H extends in the Z-axis direction.

Figure 8B:
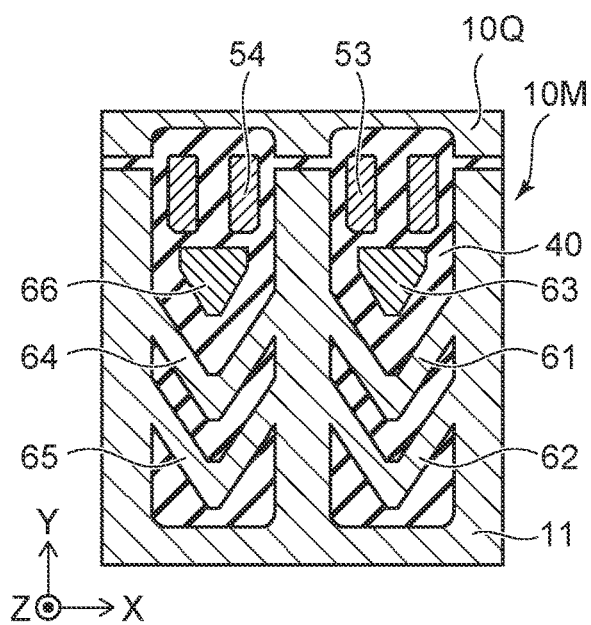

As shown in FIG. 8B, the third electrode 53 and the fourth electrode 54 are formed by filling a conductive member into the hole 58H. The conductive member may be, for example, polysilicon. Subsequently, a portion 10Q of the semiconductor member 10M is removed.

Figure 8C:
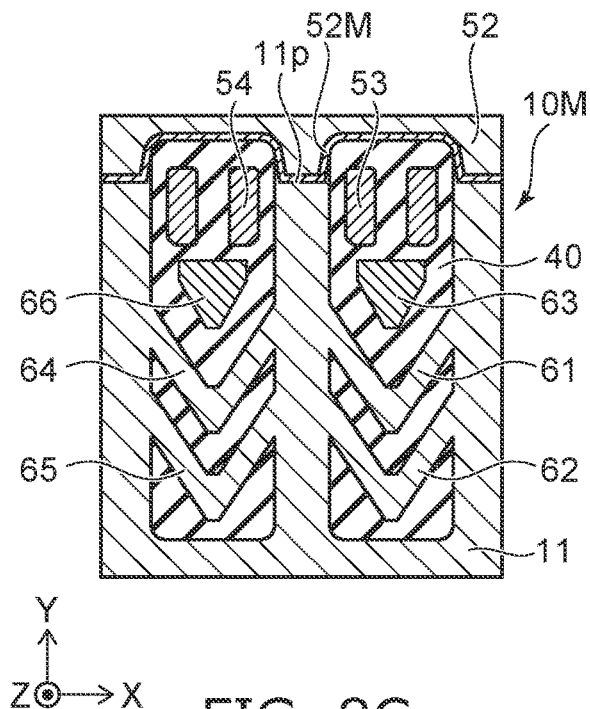

As shown in FIG. 8C, a metal film 52M is formed, and the second electrode 52 is formed. The metal film 52M can form a Schottky barrier with the electrode-facing surface 11p of the semiconductor member 10M. The metal film 52M includes, for example, at least one selected from the group consisting of Ti, W, Mo, Ta, Zr, Al, Sn, V, Re, Os, Ir, Pt, Pd, Rh, Ru, Nb, Sr, and Hf.

Figure 8D:
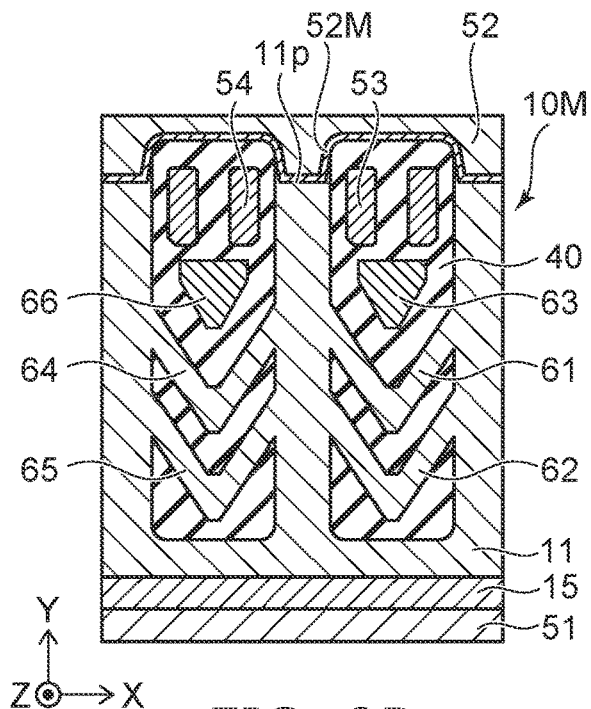

A semiconductor region 15 and the first electrode 51 are formed as shown in FIG. 8D. For example, the semiconductor region 15 is of the first conductivity type. The first-conductivity-type carrier concentration in the semiconductor region 15 is greater than the first-conductivity-type carrier concentration in the first semiconductor region 11. Thus, for example, the semiconductor device 111 can be formed.

FIGS. 9A to 9D are schematic cross-sectional views illustrating the method for manufacturing the semiconductor device according to the embodiment.

For example, FIGS. 9A to 9D show an example of a portion of the method for manufacturing the semiconductor device 110a.

Figure 9A:
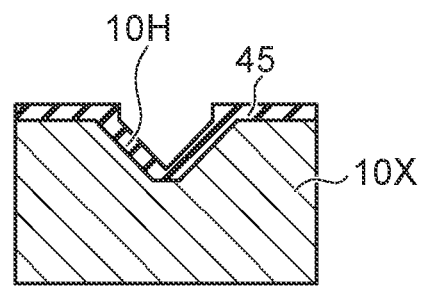
FIGS. 9A to 9D are schematic cross-sectional views illustrating the method for manufacturing the semiconductor device according to the embodiment.

As shown in FIG. 9A, a hole 10H is formed in the semiconductor member 10M. An insulating region 45 is formed at the surface of a semiconductor layer 10X that is used to form the semiconductor member 10M. For example, the insulating region 45 may be obtained by oxidizing (e.g., thermal oxidation) the surface of the semiconductor layer 10X.

Figure 9B:
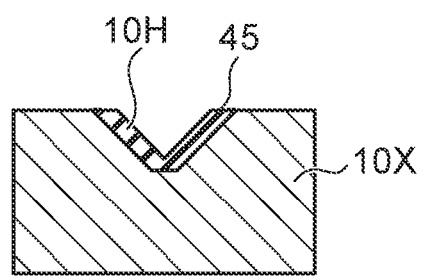

As shown in FIG. 9B, the surface is planarized. For example, the planarization may be performed by CMP (chemical mechanical planarization).

Figure 9C:
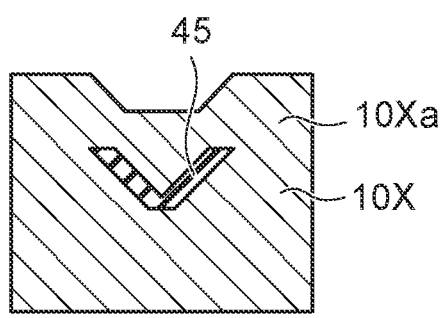

As shown in FIG. 9C, a semiconductor layer 10Xa that is used to form the semiconductor member 10M is formed. For example, the semiconductor layer 10Xa can be formed by epitaxial growth.

Figure 9D:
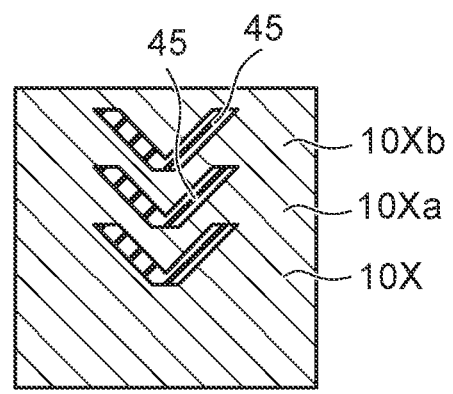

As shown in FIG. 9D, multiple insulating regions 45 can be formed by repeating the processing illustrated in FIGS.

9A to 9C. For example, a semiconductor layer 10Xb that is used to form the semiconductor member 10M is formed. The semiconductor layers that are between the multiple insulating regions 45 are used to form, for example, conductive members (e.g., the first conductive member 61, etc.).

Subsequently, the third electrode 53, the second electrode 52, and the first electrode 51 are formed. For example, the semiconductor device 110a is formed thereby.

Third Embodiment

Figure 10:
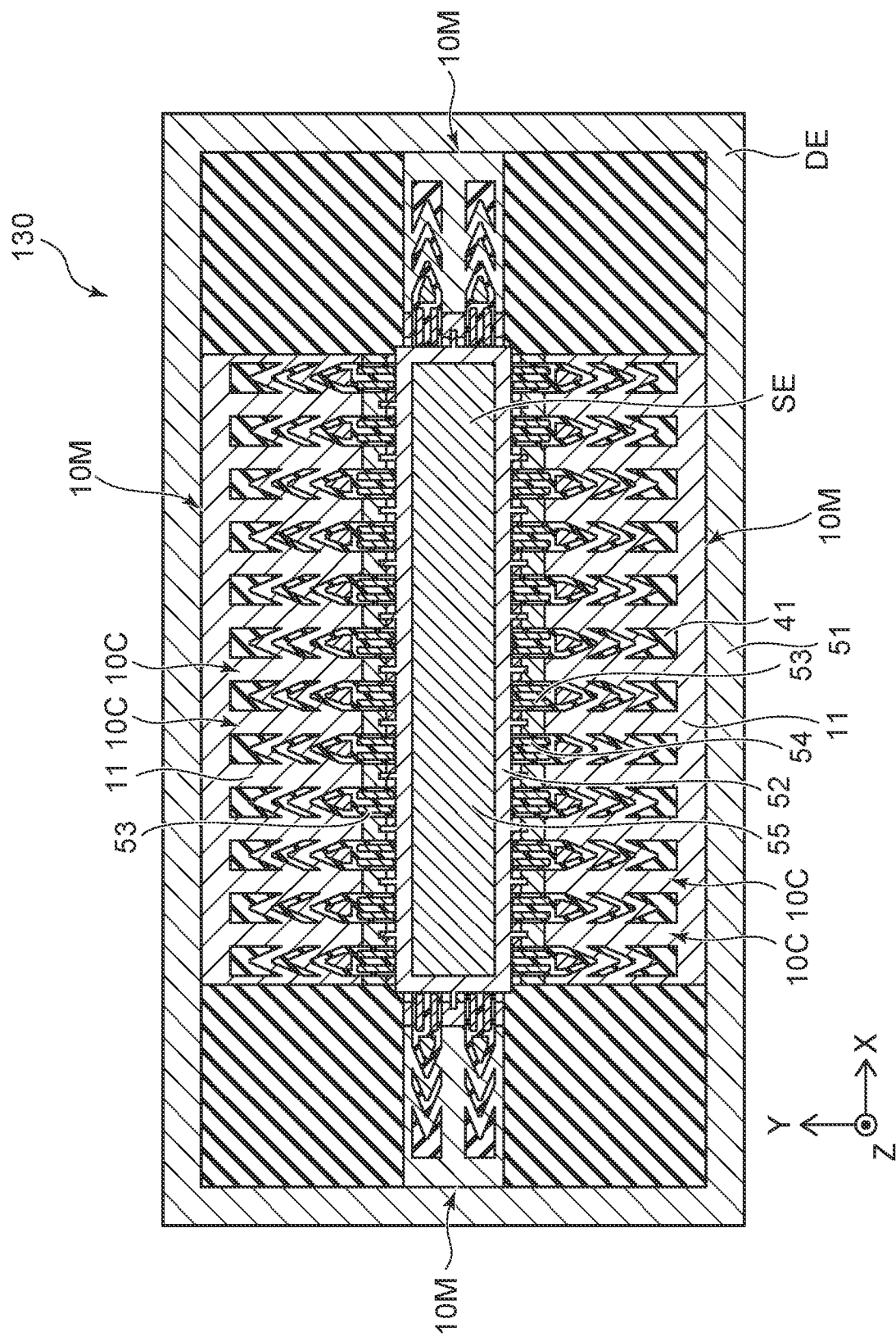
FIG. 10 is a schematic cross-sectional view illustrating a semiconductor device according to a third embodiment.

FIG. 10 is a schematic cross-sectional view illustrating a semiconductor device according to a third embodiment.

As shown in FIG. 10, the semiconductor device 130 according to the embodiment includes a ring-shaped drain electrode DE around a source electrode SE in the X-Y plane. Multiple cells 10C are located between the source electrode SE and the ring-shaped drain electrode DE. One of the multiple cells 10C includes the second electrode 52. One of the multiple cells 10C may be considered to include one of the multiple third electrodes 53 and one of the multiple fourth electrodes 54.

In the semiconductor device 130, the multiple cells 10C can be provided at high density. In the semiconductor device 130, the multiple cells 10C are continuous in a ring shape in the X-Y plane. Therefore, a termination region does not exist in the semiconductor device 130. The surface area for the termination region can be omitted thereby, and the multiple cells 10C can be provided at higher density.

Figure 11:
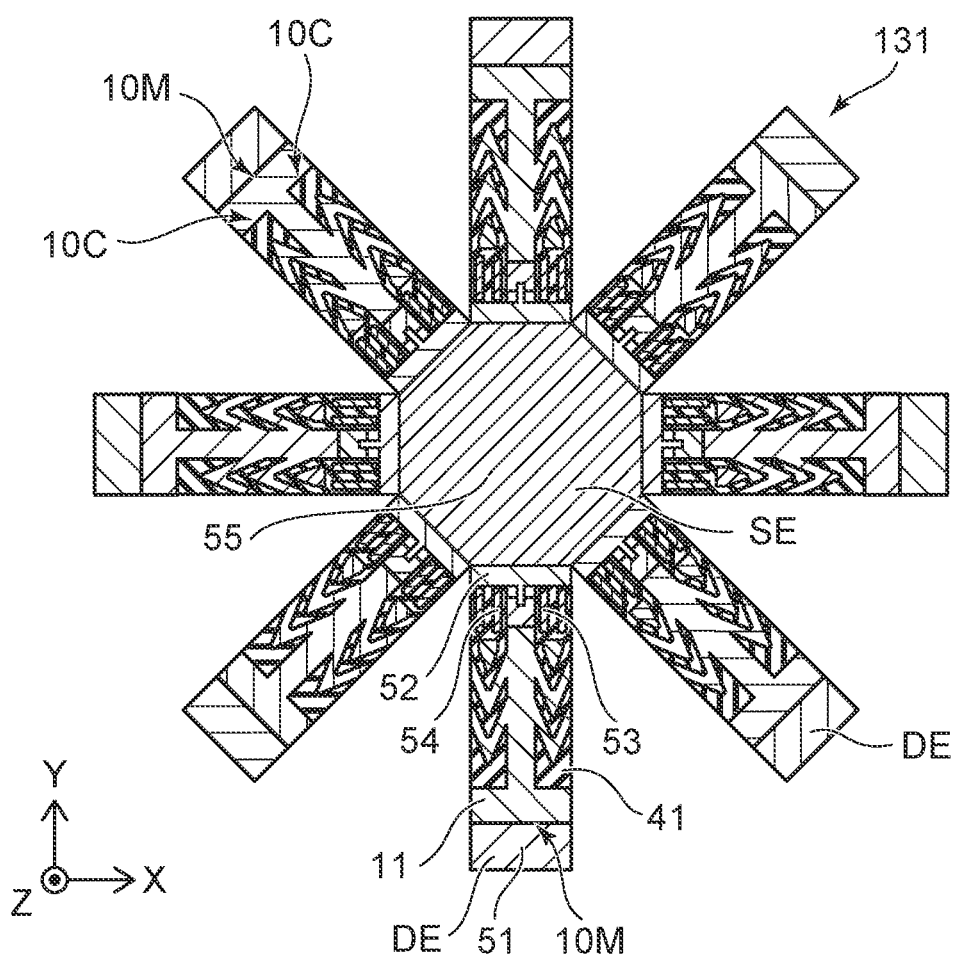
FIG. 11 is a schematic cross-sectional view illustrating a semiconductor device according to the third embodiment.

FIG. 11 is a schematic cross-sectional view illustrating a semiconductor device according to the third embodiment.

As shown in FIG. 11, the semiconductor device 131 according to the embodiment also includes multiple drain electrodes DE around the source electrode SE in the X-Y plane. The direction that connects two of the multiple drain electrodes DE crosses the direction that connects another two of the multiple drain electrodes DE. In the semiconductor device 131 as well, the multiple cells 10C are obtained at high density. In the semiconductor device 131, the multiple drain electrodes DE may be continuous with each other.

Figure 12:
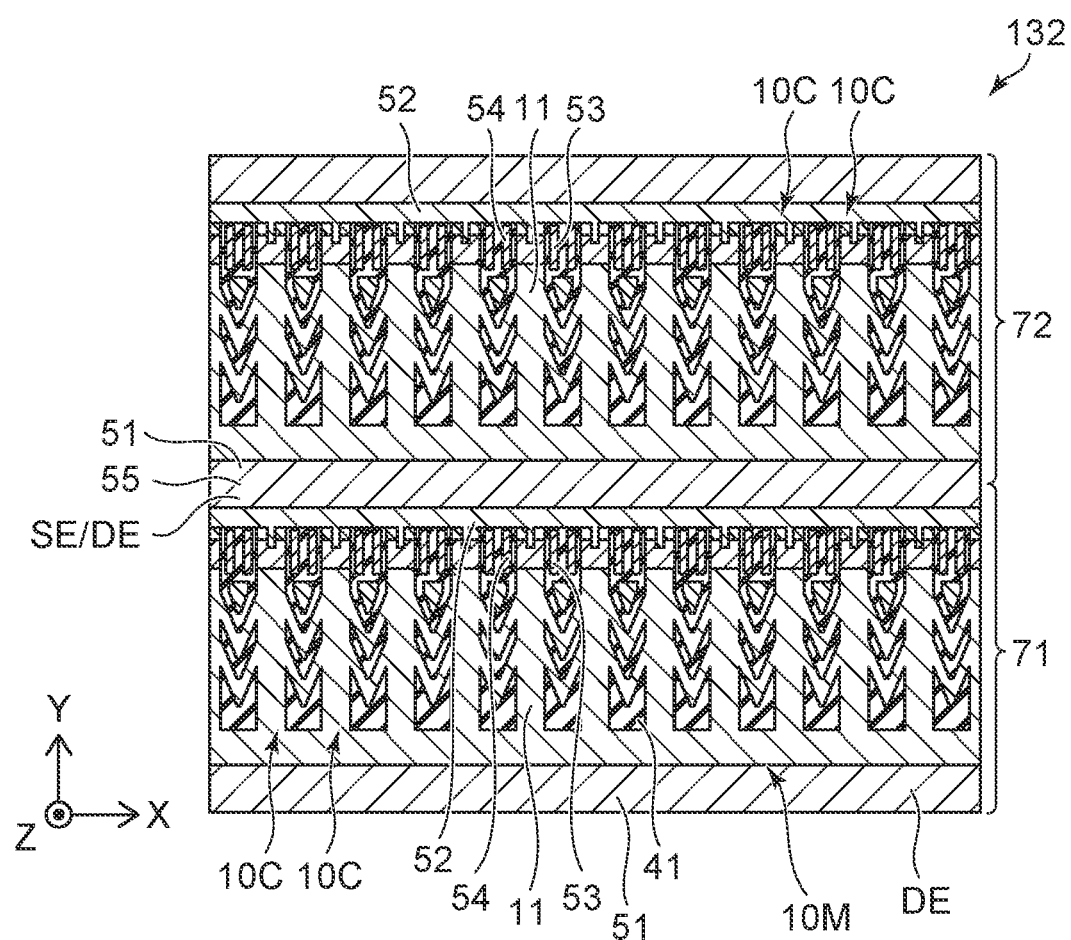
FIG. 12 is a schematic cross-sectional view illustrating a semiconductor device according to the third embodiment.

FIG. 12 is a schematic cross-sectional view illustrating a semiconductor device according to the third embodiment.

As shown in FIG. 12, the semiconductor device 132 according to the embodiment includes multiple cell groups (a first cell group 71 and a second cell group 72). In the example, the orientation from the first cell group 71 toward the second cell group 72 is along the Y-axis direction. The first cell group 71 and the second cell group 72 each include the multiple cells 10C. The multiple cells 10C are arranged in the X-axis direction. For example, a fifth electrode 55 of the first cell group 71 is continuous with the first electrode 51 of the second cell group 72. For example, the electrode (the source/drain electrode SE/DE) that is located between the first semiconductor region 11 included in the first cell group 71 and the first semiconductor region 11 included in the second cell group 72 may be considered to be the fifth electrode 55 of the first cell group 71 and the first electrode 51 of the second cell group 72.

The first cell group 71 is, for example, the transistor group at the low-voltage side. The second cell group 72 is the transistor group at the high-voltage side. For example, the semiconductor device 132 can control a high voltage.

Figure 13:
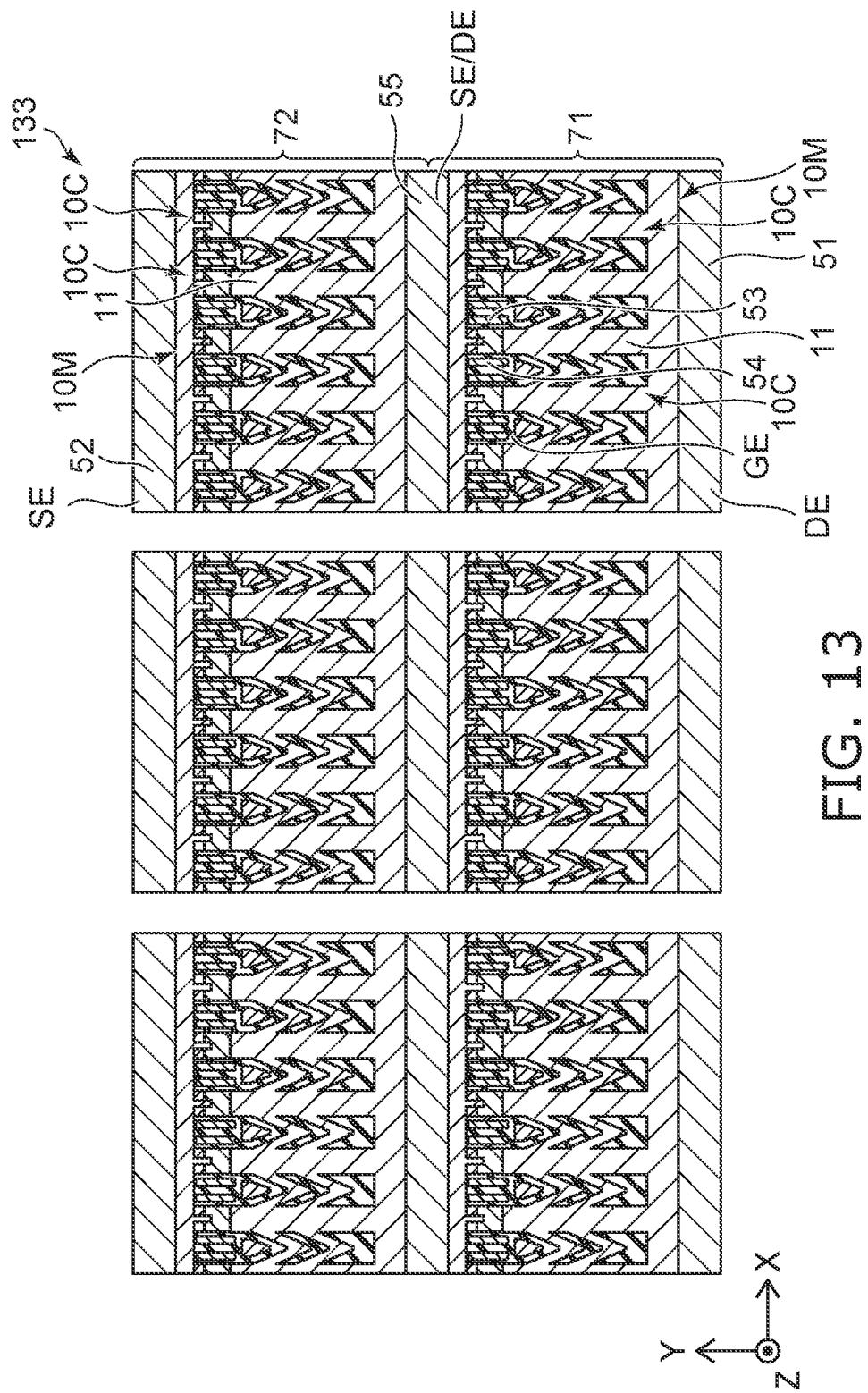
FIG. 13 is a schematic cross-sectional view illustrating a semiconductor device according to the third embodiment.

FIG. 13 is a schematic cross-sectional view illustrating a semiconductor device according to the third embodiment.

As shown in FIG. 13, the semiconductor device 133 according to the embodiment includes multiple configurations of the semiconductor device 132 illustrated in FIG. 12. The configurations of the multiple semiconductor devices 132 are arranged in the X-axis direction.

Figure 14:
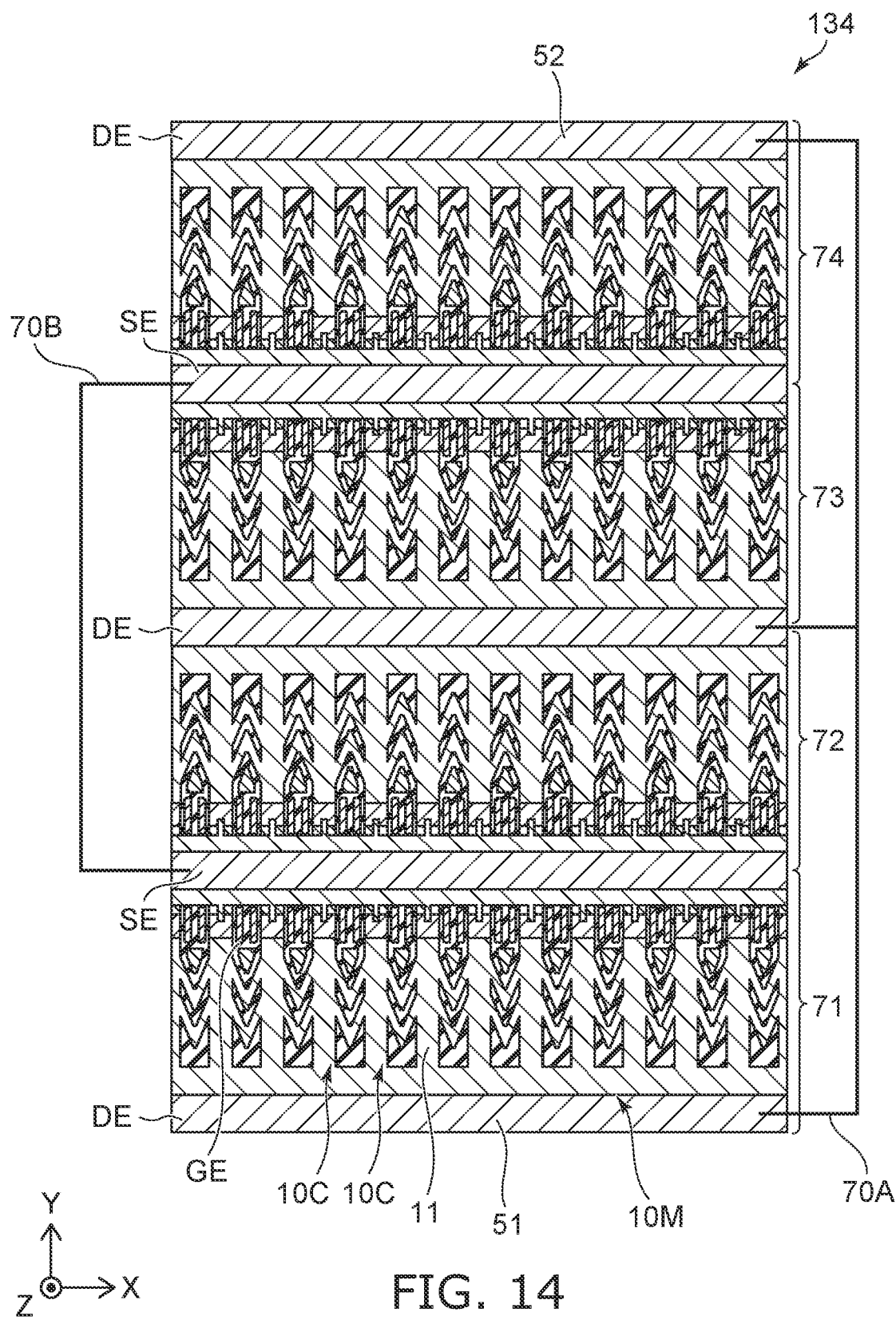
FIG. 14 is a schematic cross-sectional view illustrating a semiconductor device according to the third embodiment.

FIG. 14 is a schematic cross-sectional view illustrating a semiconductor device according to the third embodiment.

As shown in FIG. 14, the semiconductor device 134 according to the embodiment includes multiple cell groups (the first to fourth cell groups 71 to 74). The second cell group 72 is between the first cell group 71 and the fourth cell group 74. The third cell group 73 is between the second cell group 72 and the fourth cell group 74.

The orientation from the drain electrode DE (the first electrode 51) of the first cell group 71 toward the source electrode SE (the second electrode 52) of the first cell group 71 is opposite to the orientation from the drain electrode DE (the first electrode 51) of the second cell group 72 toward the source electrode SE (the second electrode 52) of the second cell group 72. The orientation from the drain electrode DE (the first electrode 51) of the third cell group 73 toward the source electrode SE (the second electrode 52) of the third cell group 73 is opposite to the orientation from the drain electrode DE (the first electrode 51) of the fourth cell group 74 toward the source electrode SE (the second electrode 52) of the fourth cell group 74. The orientation from the drain electrode DE (the first electrode 51) of the first cell group 71 toward the source electrode SE (the second electrode 52) of the first cell group 71 is the same as the orientation from the drain electrode DE (the first electrode 51) of the third cell group 73 toward the source electrode SE (the second electrode 52) of the third cell group 73.

The drain electrode DE is shared between the second cell group 72 and the third cell group 73. The source electrode SE is shared between the first cell group 71 and the second cell group 72. The source electrode SE is shared between the third cell group 73 and the fourth cell group 74. In the example, the drain electrodes DE of the first to fourth cell groups 71 to 74 are electrically connected to each other by an interconnect 70A. In the example, the source electrodes SE of the first to fourth cell groups 71 to 74 are electrically connected to each other by an interconnect 70B. According to the semiconductor device 134, the multiple cells 10C can be provided at high density.

Figure 15:
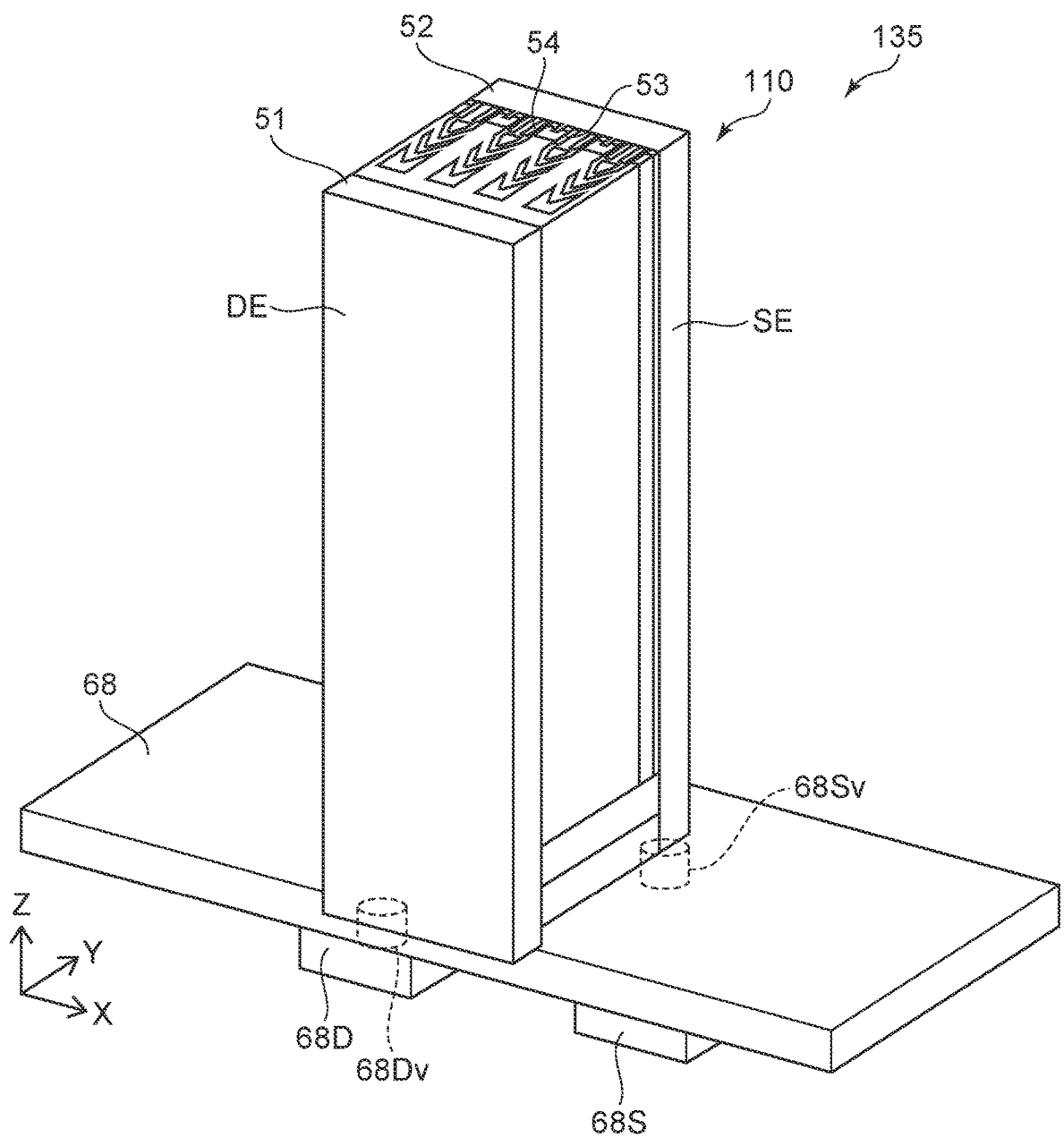
FIG. 15 is a schematic perspective view illustrating a semiconductor device according to the third embodiment.

FIG. 15 is a schematic perspective view illustrating a semiconductor device according to the third embodiment.

As shown in FIG. 15, the semiconductor device 135 according to the embodiment further includes a base body 68 in addition to the configuration of the semiconductor device 110. For example, the configuration of the semiconductor device 110 is located on the base body 68. An electrode 68S for the source and an electrode 68D for the drain are located under the base body 68. For example, a source connection member 68Sv and a drain connection member 68Dv are provided. The source connection member 68Sv and the drain connection member 68Dv extend in the Z-axis direction through the base body 68. The source connection member 68Sv electrically connects the source electrode SE and the electrode 68S for the source. The drain connection member 68Dv electrically connects the drain electrode DE and the electrode 68D for the drain.

Figure 16:
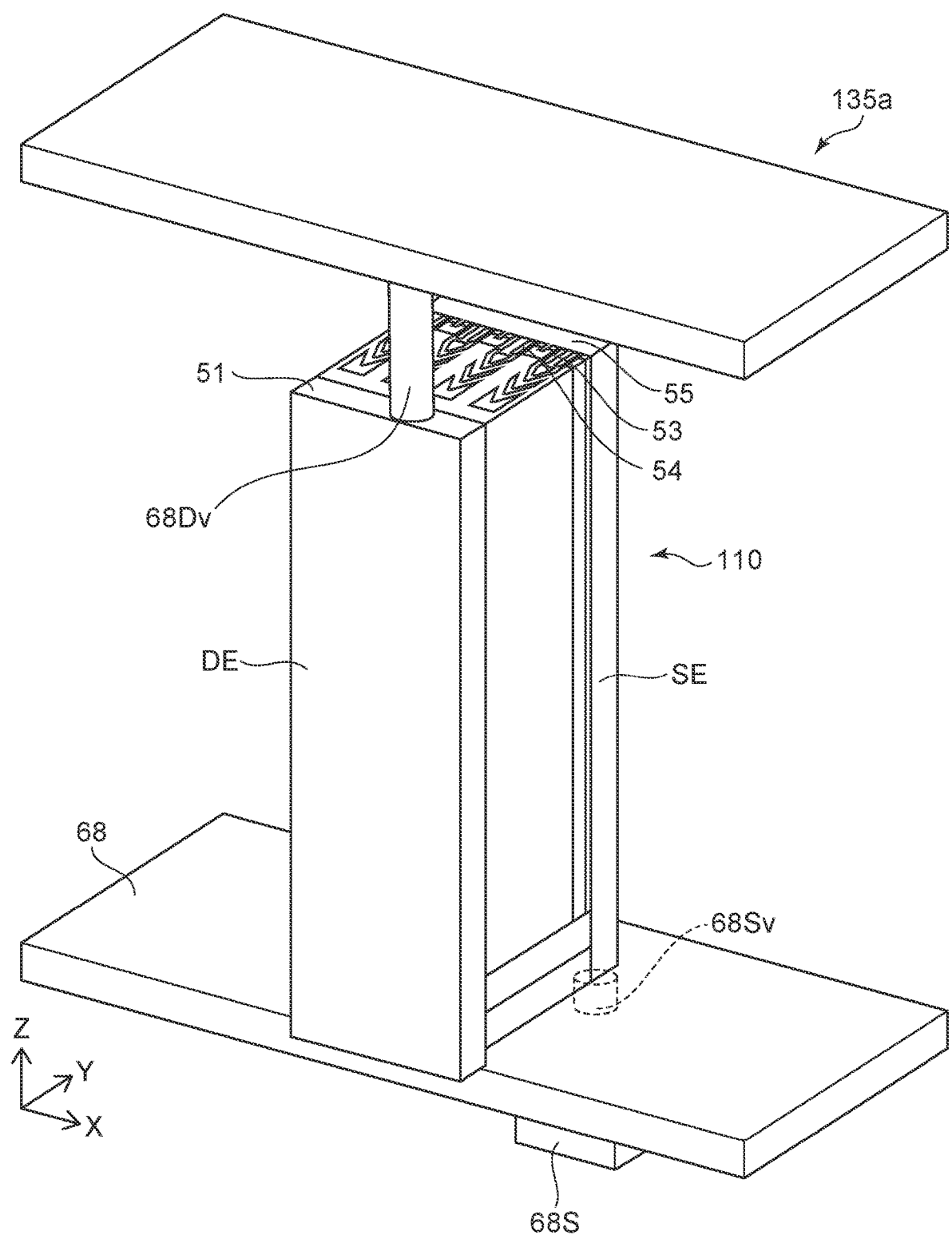
FIG. 16 is a schematic perspective view illustrating a semiconductor device according to the third embodiment.

FIG. 16 is a schematic perspective view illustrating a semiconductor device according to the third embodiment.

As shown in FIG. 16, the connection position of the drain connection member 68Dv in the semiconductor device 135a according to the embodiment is different from the connection position in the semiconductor device 135. In the semiconductor device 135a, the position in the Z-axis direction of the drain electrode DE is between the position in the Z-axis direction of the source connection member 68Sv and the position in the Z-axis direction of the drain connection member 68Dv.

Figure 17:
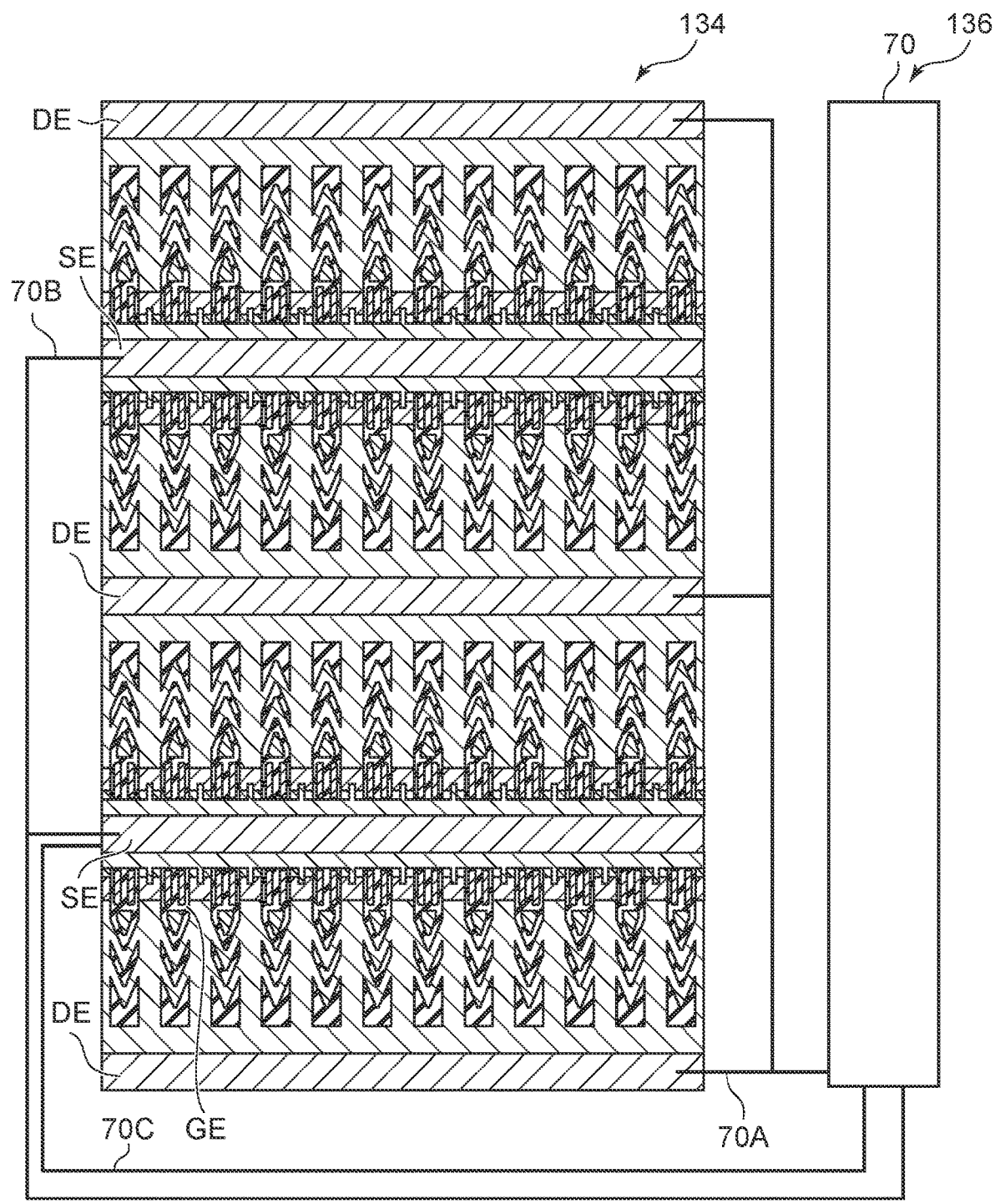
FIG. 17 is a schematic cross-sectional view illustrating a semiconductor device according to the third embodiment.

FIG. 17 is a schematic cross-sectional view illustrating a semiconductor device according to the third embodiment.

As shown in FIG. 17, the semiconductor device 136 according to the embodiment further includes a controller 70 in addition to the configuration of the semiconductor device 134. For example, the controller 70 is electrically connected with the drain electrode DE by the interconnect 70A. For example, the controller 70 is electrically connected with the source electrode SE by the interconnect 70B. For example, the controller 70 is electrically connected with a gate electrode GE by an interconnect 70C.

According to embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, conductive members, semiconductor members, insulating part region, connection members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first electrode;
    a second electrode including a first electrode portion, a direction from the first electrode toward the first electrode portion being along a first direction;
    a third electrode, a direction from the first electrode toward the third electrode being along the first direction;
    a semiconductor member including a first semiconductor region of a first conductivity type,
        the first semiconductor region including a first partial region, a second partial region, and a third partial region,
        the first partial region being between the first electrode and the first electrode portion,
        the second partial region being between the first electrode and the third electrode,
        a direction from the first partial region toward the second partial region being along a second direction crossing the first direction,
        the third partial region being between the first partial region and the first electrode portion,
        the third partial region including a first position and a second position,
        the second position being between the first partial region and the first position;
    a first conductive member including a first portion and a second portion,
        the first portion being between the second partial region and the third electrode in the first direction,
        the first portion being connected with the first position,
        the second portion being connected with the first portion,
        a position in the first direction of the second portion being between a position in the first direction of the first portion and a position in the first direction of the second partial region; and
    an insulating part region including a first insulating region and a second insulating region,
        the first insulating region being between the third electrode and a portion of the semiconductor member in the second direction,
        the second insulating region being between the second position and the first electrode in the first direction,
        the second insulating region being between the second position and the second portion in the second direction.

2. The device according to claim 1, wherein
the first portion includes a first semiconductor material, and
the first portion is continuous with the third partial region.

3. The device according to claim 1, wherein
the insulating part region further includes a third insulating region, and
the third insulating region is between the first conductive member and the third electrode.

4. The device according to claim 1, wherein
the first conductive member includes a middle portion between the first portion and the second portion, and
the middle portion includes an oblique surface that is oblique to the first and second directions.

5. The device according to claim 1, wherein
a position in the second direction of the first portion is between a position in the second direction of the third partial region and a position in the second direction of the second portion.

6. The device according to claim 1, wherein
the semiconductor member further includes:
    a second semiconductor region of a second conductivity type; and
    a third semiconductor region of the first conductivity type,
the second semiconductor region is between the third partial region and the second electrode in the first direction,
a direction from the second semiconductor region toward the third electrode is along the second direction,
at least a portion of the third semiconductor region is between the second semiconductor region and the second electrode, and at least a portion of the first insulating region is between the second semiconductor region and the third electrode.

7. The device according to claim 1, wherein
the first semiconductor region includes an electrode-facing surface,
the electrode-facing surface is between the third partial region and the first electrode portion, and
at least a portion of the first insulating region is between the electrode-facing surface and the third electrode.

8. The device according to claim 7, wherein
the electrode-facing surface has a Schottky contact with the first electrode portion.

9. The device according to claim 1, further comprising:
a second conductive member including a third portion and a fourth portion,
the third partial region further including a third position and a fourth position,
the third position being between the first partial region and the first position,
the fourth position being between the first partial region and the third position,
the third portion being between the second partial region and the first portion in the first direction,
the third portion being connected with the third position,
the fourth portion being connected with the third portion,
a position in the first direction of the fourth portion being between a position in the first direction of the third portion and the position in the first direction of the second partial region,
the insulating part region further including a fourth insulating region,
the fourth insulating region being between the fourth position and the fourth portion in the second direction.

10. The device according to claim 9, wherein
the third portion includes a second semiconductor material, and
the third portion is continuous with the third position.

11. The device according to claim 1, further comprising:
a third conductive member,
a position in the first direction of the third conductive member being between the position in the first direction of the first portion and a position in the first direction of the third electrode,
the third partial region including a fifth position,
the fifth position being between the first position and the first electrode portion,
the insulating part region further including a fifth insulating region,
the fifth insulating region being between the first conductive member and the third electrode,
the third insulating region being between the fifth position and the third electrode,
the third conductive member being electrically connected with the second electrode or being electrically connectable with the second electrode.

12. The device according to claim 1, further comprising:
a first member including a first surface,
the first surface being along a plane including the first and second directions,
the semiconductor member being located at the first surface.

13. The device according to claim 12, wherein
the first electrode and the second electrode extend along a third direction crossing the plane including the first and second directions.

14. The device according to claim 1, further comprising:
a first member,
the first member being between the first electrode and the first semiconductor region.

15. The device according to claim 1, further comprising:
a fourth electrode; and
a fourth conductive member,
a direction from the fourth electrode toward the third electrode being along the second direction,
the first semiconductor region further including a fourth partial region,
the first partial region being between the fourth partial region and the second partial region in the second direction,
the fourth conductive member including a fifth portion and a sixth portion,
the fifth portion being between the fourth partial region and the fourth electrode in the first direction,
the fifth portion being connected with the first position,
the sixth portion being connected with the fifth portion,
a position in the first direction of the sixth portion being between a position in the first direction of the fifth portion and a position in the first direction of the fourth partial region,
the insulating part region including a sixth insulating region, a seventh insulating region, and an eighth insulating region,
the sixth insulating region being between the fourth electrode and a portion of the semiconductor member in the second direction,
the seventh insulating region being between the sixth portion and the second position in the second direction,
the eighth insulating region being between the fourth conductive member and the fourth electrode.

16. The device according to claim 1, wherein
the first electrode is located around the second electrode in a plane including the first and second directions,
a plurality of cells is located between the second electrode and the first electrode, and
one of the plurality of cells includes the third electrode and the first conductive member.

17. The device according to claim 1, wherein
a first cell group and a second cell group are provided,
the first cell group and the second cell group each include the second electrode, and
a direction from the first cell group toward the second cell group is along the first direction.

18. The device according to claim 1, wherein
first to fourth cell groups are provided,
the first to fourth cell groups each include the first and second electrodes,
the second cell group is between the first cell group and the fourth cell group,
the third cell group is between the second cell group and the fourth cell group,
an orientation from the first electrode of the first cell group toward the second electrode of the first cell group is opposite to an orientation from the first electrode of the second cell group toward the second electrode of the second cell group,
an orientation from the first electrode of the third cell group toward the second electrode of the third cell group is opposite to an orientation from the first electrode of the fourth cell group toward the second electrode of the fourth cell group, and
the orientation from the first electrode of the first cell group toward the second electrode of the first cell group is the same as the orientation from the first electrode of the third cell group toward the second electrode of the third cell group.

19. A semiconductor device, comprising:
a first electrode;
a second electrode including a first electrode portion, a direction from the first electrode toward the first electrode portion being along a first direction;
a third electrode, a direction from the first electrode toward the third electrode being along the first direction;
a semiconductor member including a first semiconductor region of a first conductivity type,
 the first semiconductor region including a first partial region, a second partial region, a third partial region, a first portion, and a second portion,
 the first partial region being between the first electrode and the first electrode portion,
 the second partial region being between the first electrode and the third electrode,
 a direction from the first partial region toward the second partial region being along a second direction crossing the first direction,
 the third partial region being between the first partial region and the first electrode portion,
 the third partial region including a first position and a second position,
 the second position being between the first partial region and the first position,
 the first portion being between the second partial region and the third electrode in the first direction,
 the first portion being connected with the first position,
 the second portion being connected with the first portion,
 a position in the first direction of the second portion being between a position in the first direction of the first portion and a position in the first direction of the second partial region,
an insulating part region including a first insulating region and a second insulating region,
 the first insulating region being between the third electrode and a portion of the semiconductor member in the second direction,
 the second insulating region being between the second position and the first electrode in the first direction,
 the second insulating region being between the second position and the second portion in the second direction.

20. A semiconductor device, comprising:
a first electrode;
a semiconductor member including
 a first semiconductor region located on the first electrode, the first semiconductor region being of a first conductivity type,
 a second semiconductor region located on a portion of the first semiconductor region, the second semiconductor region being of a second conductivity type, and
 a third semiconductor region located on the second semiconductor region, the third semiconductor region being of the first conductivity type;
a second electrode located on the third semiconductor region and electrically connected to the third semiconductor region;
a gate electrode located between the first semiconductor region and the second electrode;
a first insulating member located between the gate electrode and the semiconductor member and between the gate electrode and the second electrode; and
a second insulating member located in the first semiconductor region and separated from the first insulating member in a first direction from the first electrode toward the second electrode,
the second insulating member including
a first portion,
a second portion extending from the first portion toward the second electrode in the first direction, and
a third portion extending from the first portion toward the second electrode in the first direction, the third portion being separated from the second portion in a second direction crossing the first direction.

* * * * *